United States Patent
Rops et al.

(10) Patent No.: US 10,551,748 B2
(45) Date of Patent: Feb. 4, 2020

(54) FLUID HANDLING STRUCTURE, A LITHOGRAPHIC APPARATUS AND A DEVICE MANUFACTURING METHOD

(71) Applicant: ASML NETHERLANDS B.V., Veldhoven (NL)

(72) Inventors: Cornelius Maria Rops, Waalre (NL); Walter Theodorus Matheus Stals, Veldhoven (NL); David Bessems, Eindhoven (NL); Giovanni Luca Gattobigio, Eindhoven (NL); Victor Manuel Blanco Carballo, Veldhoven (NL); Erik Henricus Egidius Catharina Eummelen, Eindhoven (NL); Ronald Van Der Ham, Maarheeze (NL); Frederik Antonius Van Der Zanden, Veldhoven (NL); Wilhelmus Antonius Wernaart, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/537,214

(22) PCT Filed: Dec. 7, 2015

(86) PCT No.: PCT/EP2015/078842
§ 371 (c)(1),
(2) Date: Jun. 16, 2017

(87) PCT Pub. No.: WO2016/096508
PCT Pub. Date: Jun. 23, 2016

(65) Prior Publication Data
US 2017/0363948 A1    Dec. 21, 2017

(30) Foreign Application Priority Data
Dec. 19, 2014 (EP) .................................. 14199085

(51) Int. Cl.
*G03F 7/20* (2006.01)
*G03B 27/52* (2006.01)

(52) U.S. Cl.
CPC ......... *G03F 7/70341* (2013.01); *G03B 27/52* (2013.01); *G03F 7/70716* (2013.01); *G03F 7/70775* (2013.01)

(58) Field of Classification Search
CPC .................................................. G03F 7/70341
See application file for complete search history.

(56) References Cited

U.S. PATENT DOCUMENTS

| 4,509,852 A | 4/1985 | Tabarelli et al. |
| 7,224,433 B2 | 5/2007 | Mertens et al. |

(Continued)

FOREIGN PATENT DOCUMENTS

| CN | 102375348 A | 3/2012 |
| EP | 1 420 298 | 5/2004 |

(Continued)

OTHER PUBLICATIONS

International Search Report and Written Opinion issued for corresponding International Patent Application No. PCT/EP2015/078842, dated May 3, 2016.

(Continued)

*Primary Examiner* — Michelle M Iacoletti
(74) *Attorney, Agent, or Firm* — Pillsbury Winthrop Shaw Pittman, LLP

(57) ABSTRACT

A fluid handling structure for a lithographic apparatus configured to contain immersion fluid to a region, the fluid handling structure having, at a boundary of a space: at least one gas knife opening in a radially outward direction of the space; and at least one gas supply opening in the radially outward direction of the at least gas knife opening relative to the space. The gas knife opening and the gas supply (Continued)

opening both provide substantially pure $CO_2$ gas so as to provide a substantially pure $CO_2$ gas environment adjacent to, and radially outward of, the space.

20 Claims, 10 Drawing Sheets

(56) References Cited

U.S. PATENT DOCUMENTS

| | | |
|---|---|---|
| 7,292,313 B2 | 11/2007 | Poon et al. |
| 8,416,388 B2 | 4/2013 | Eummelen et al. |
| 2004/0207824 A1 | 10/2004 | Lof et al. |
| 2006/0038968 A1 | 2/2006 | Kemper et al. |
| 2006/0158627 A1 | 7/2006 | Kemper et al. |
| 2007/0243697 A1 | 10/2007 | Leenders et al. |
| 2008/0043211 A1 | 2/2008 | Poon et al. |
| 2008/0212046 A1 | 9/2008 | Riepen et al. |
| 2009/0122283 A1 | 5/2009 | Hasegawa |
| 2009/0201472 A1* | 8/2009 | Kato ............... G03B 27/32 355/30 |
| 2009/0279060 A1 | 11/2009 | Direcks et al. |
| 2009/0279062 A1 | 11/2009 | Direcks et al. |
| 2010/0045949 A1 | 2/2010 | Nakano et al. |
| 2010/0103391 A1 | 4/2010 | Van Den Dungen et al. |
| 2010/0259735 A1 | 10/2010 | Eummelen et al. |
| 2010/0313974 A1 | 12/2010 | Riepen et al. |
| 2011/0134401 A1 | 6/2011 | Rops et al. |
| 2011/0188012 A1 | 8/2011 | Direcks et al. |
| 2011/0199593 A1 | 8/2011 | Riepen et al. |
| 2011/0199601 A1 | 8/2011 | Kaneko et al. |
| 2011/0261332 A1 | 10/2011 | Cortie et al. |
| 2012/0062860 A1 | 3/2012 | Chonan |
| 2012/0069309 A1* | 3/2012 | Willems ............ G03F 7/70341 355/30 |
| 2012/0120376 A1 | 5/2012 | Bessems et al. |
| 2013/0016333 A1 | 1/2013 | Cortie et al. |
| 2013/0070220 A1 | 3/2013 | Bessems et al. |
| 2013/0155380 A1 | 6/2013 | Van Der Gaag et al. |

FOREIGN PATENT DOCUMENTS

| | | | | |
|---|---|---|---|---|
| EP | 1 482 372 | | 12/2004 | |
| JP | 2007-005363 | | 1/2007 | |
| JP | 2007-288187 | A | 11/2007 | |
| JP | 2012-44177 | A | 3/2012 | |
| JP | 2012-89843 | A | 5/2012 | |
| JP | 2012089843 | A * | 5/2012 | ......... G03F 7/70341 |
| JP | 2013-131746 | A | 7/2013 | |
| KR | 10-2008-0075727 | | 8/2008 | |
| KR | 10-2010-0113043 | A | 10/2010 | |
| WO | 99/49504 | | 9/1999 | |
| WO | 2006/101120 | | 9/2006 | |
| WO | 2014/104139 | A1 | 7/2014 | |

OTHER PUBLICATIONS

Office Action dated Sep. 26, 2018 issued in corresponding Chinese Patent Application No. 201580069423.1 with English translation.
Notice of Reasons for Rejection dated May 17, 2018 issued in corresponding Japanese Patent Application No. 2017-526944.
Decision of Rejection dated Jan. 9, 2019 issued in corresponding Japanese Patent Application No. 2017-526944 with English translation.
Notification of Reasons for Refusal dated Nov. 16, 2018 issued in corresponding Korean Patent Application No. 10-2017-7020110 with English translation.

* cited by examiner

FLUID HANDLING STRUCTURE, A LITHOGRAPHIC APPARATUS AND A DEVICE MANUFACTURING METHOD

CROSS-REFERENCE TO RELATED APPLICATIONS

This application is the U.S. national phase entry of PCT patent application no. PCT/EP2015/078842, which was filed on Dec. 7, 2015, which claims priority of EP application no. 1,419,9085.3, which was filed on Dec. 19, 2014, and which applications are incorporated herein in its entirety by reference.

FIELD

The present invention relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits.

It has been proposed to immerse the substrate in the lithographic projection apparatus in a liquid having a relatively high refractive index, e.g. water, so as to fill a space between the final element of the projection system PS and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate, or the substrate and the substrate table, in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by an immersion system, device, structure or apparatus. In an embodiment the immersion system may supply immersion fluid and may be referred to as a fluid supply system. In an embodiment the immersion system may at least partly confine immersion fluid and may be referred to as a fluid confinement system. In an embodiment the immersion system may provide a barrier to immersion fluid and thereby be referred to as a barrier member, such as a fluid confinement structure. In an embodiment the immersion system creates or uses a flow of gas, for example to help in controlling the flow and/or the position of the immersion fluid. The flow of gas may form a seal to confine the immersion fluid so the immersion system may comprise a fluid handling structure, which may be referred to as a seal member, to provide the flow of gas. In an embodiment, immersion liquid is used as the immersion fluid. In that case the immersion system may be a liquid handling system.

SUMMARY

If the immersion liquid is confined by an immersion system to a localized area on a surface which is under the projection system, a meniscus extends between the immersion system and the surface. If the meniscus collides with a droplet on the surface, this may result in inclusion of a bubble in the immersion liquid. The droplet may be present on the surface for various reasons, for example, due to a leakage from the immersion system. A bubble in the immersion liquid can lead to imaging errors, for example by interfering with a projection beam during imaging of the substrate.

It is desirable, for example, to provide a lithographic apparatus in which the likelihood of bubble inclusion is at least reduced.

In the present invention, there is provided an immersion system comprising a fluid handling structure configured to contain immersion fluid to a region external to the fluid handling structure, the fluid handling structure having, at a boundary of a space: at least one gas knife opening in a radially outward direction from the space; and at least one gas supply opening in the radially outward direction from the at least one gas knife opening relative to the space; and the immersion system further comprising a gas supply system configured to supply substantially pure $CO_2$ gas through the at least one gas knife opening and the at least one gas supply opening so as to provide an atmosphere of substantially pure $CO_2$ gas adjacent to, and radially outward of, the space.

In the present invention, there is provided a device manufacturing method comprising projecting a projection beam of radiation via an immersion fluid onto a substrate in a lithographic apparatus comprising an immersion system, wherein the immersion system comprises a fluid handling structure configured to contain the immersion fluid to a region external to the fluid handling structure, the fluid handling structure having, at a boundary of a space: at least one gas knife opening in a radially outward direction from the space; and at least one gas supply opening in the radially outward direction from the at least one gas knife opening relative to the space; and the method comprising supplying substantially pure $CO_2$ gas through the at least one gas knife opening and the at least one gas supply opening so as to provide an atmosphere of substantially pure $CO_2$ gas adjacent to, and radially outward of, the space.

In the present invention, there is provided a lithographic apparatus comprising an immersion system comprising a fluid handling structure configured to contain immersion fluid to a region external to the fluid handling structure, the fluid handling structure having, at a boundary of a space: at least one gas knife opening in a radially outward direction from the space; and at least one gas supply opening in the radially outward direction from the at least one gas knife opening relative to the space; and the immersion system further comprising a gas supply system configured to supply substantially pure $CO_2$ gas the at least one gas knife opening and the at least one gas supply opening so as to provide an atmosphere of substantially pure $CO_2$ gas adjacent to, and radially outward of, the space.

In the present invention, there is provided an immersion system comprising a fluid handling structure configured to contain immersion fluid to a region, the fluid handling structure having, at a boundary of a space: at least one gas knife opening in a radially outward direction from the space; at least one gas supply opening in the radially outward direction from the at least one gas knife opening relative to the space; and a gas supply system configured to supply gas through the at least one gas knife opening and the at least one gas supply opening, wherein gas exits the at least one gas knife opening at a higher gas velocity than gas exiting the at least one gas supply opening.

In the present invention, there is provided a device manufacturing method comprising projecting a projection beam of radiation via an immersion fluid onto a substrate in a lithographic apparatus comprising an immersion system, wherein the immersion system comprises a fluid handling structure configured to contain the immersion fluid to a region external to the fluid handling structure, the fluid handling structure having, at a boundary of a space: at least one gas knife opening in a radially outward direction from the space; and at least one gas supply opening in the radially outward direction from the at least one gas knife opening relative to the space; and the method comprising supplying gas through the at least one gas knife opening and the at least one gas supply opening, wherein gas exits the at least one gas knife opening at a higher gas velocity than gas exiting the at least one gas supply opening.

In the present invention, there is provided a lithographic apparatus comprising an immersion system comprising a fluid handling structure configured to contain immersion fluid to a region external to the fluid handling structure, the fluid handling structure having, at a boundary of a space: at least one gas knife opening in a radially outward direction from the space; and at least one gas supply opening in the radially outward direction from the at least one gas knife opening relative to the space; and the immersion system further comprising a gas supply system configured to supply gas through the at least one gas knife opening and the at least one gas supply opening, wherein gas exits the at least one gas knife opening at a higher gas velocity than gas exiting the at least one gas supply opening.

In the present invention there is provided a fluid handling structure configured to contain immersion fluid to a region, the fluid handling structure having, at a boundary of a space: at least one gas knife opening in a radially outward direction from the space; and at least one gas supply opening in the radially outward direction from the at least one gas knife opening relative to the space, wherein the at least one gas supply opening comprises a mesh.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
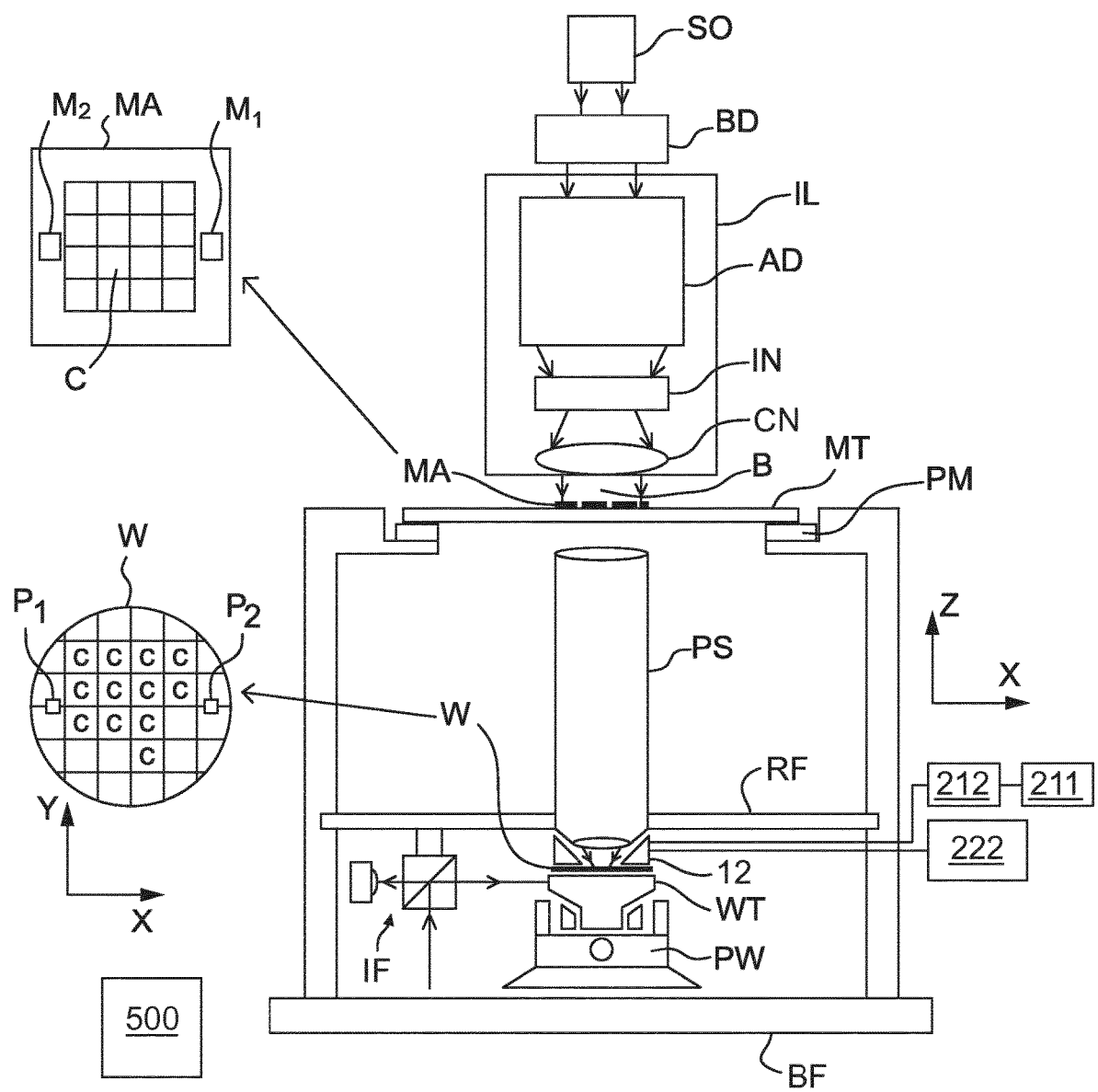
FIG. 1 depicts a lithographic apparatus according to an embodiment of the invention.

FIG. 1 schematically depicts a lithographic apparatus according to an embodiment of the invention. The lithographic apparatus comprises:

an illuminator (otherwise referred to as an illumination system) IL configured to condition a projection beam B, the projection beam B being a radiation beam (e.g. UV radiation, DUV radiation or any other suitable radiation);

a support structure (e.g. a mask support structure/mask table) MT constructed to support a patterning device (e.g. a mask) MA and connected to a first positioner PM configured to accurately position the patterning device MA in accordance with certain parameters;

a support table, e.g. a sensor table to support one or more sensors, and/or a substrate table (e.g. a wafer table) WT or "substrate support" constructed to hold a substrate (e.g. a resist-coated substrate) W connected to a second positioning device PW configured to accurately position the substrate W in accordance with certain parameters; and a projection system (e.g. a refractive projection lens system) PS configured to project a pattern imparted to the projection beam B by patterning device MA onto a target portion C (e.g. comprising one or more dies) of the substrate W.

The illuminator IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a projection beam B with a pattern in its cross-section such as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam (e.g. a projection beam B) in different directions. The tilted mirrors impart a pattern in a projection beam B which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable minor array of a type as referred to above, or employing a reflective mask).

The lithographic apparatus may comprise a measurement table (not depicted in FIG. 1) that is arranged to hold measurement equipment, such as sensors to measure properties of the projection system PS. In an embodiment, the measurement table is not configured to hold a substrate W. The lithographic apparatus may be of a type having two (dual stage) or more tables (or stage or support), e.g., two or more substrate tables WT, or a combination of one or more substrate tables WT and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support), e.g. two or more support structures MT, which may be used in parallel in a similar manner to substrate tables WT, sensor tables and measurement tables.

Referring to FIG. 1, the illuminator IL receives a projection beam B from a source SO of radiation. The source SO and the lithographic apparatus may be separate entities, for example when the source SO is an excimer laser. In such cases, the source SO is not considered to form part of the lithographic apparatus and the projection beam B is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD configured to adjust the angular intensity distribution of the projection beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the projection beam B, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The projection beam B is incident on the patterning device (e.g., mask) MA, which is held on the support structure (e.g., mask table) MT, and is patterned by the patterning device MA. Having traversed the patterning device MA, the projection beam B passes through the projection system PS, which focuses the projection beam B onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which both form part of the first positioning device PM. Similarly, movement of the substrate table WT may be realized using a long-stroke module and a short-stroke module, which both form part of the second positioning device PW. The long-stroke module is arranged to move the short-stroke module over a long range with limited precision. The short-stroke module is arranged to move the support structure MT and/or substrate table WT over a short range relative to the long-stroke module with high precision. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Marks located in spaces between the target portions C are known as scribe-lane alignment marks). Similarly, in situations in which more than one die is provided on the patterning device MA, the mask alignment marks Ml, M2 may be located between the dies.

The depicted lithographic apparatus may be used to expose a substrate W in at least one of the following modes of use:

1. In step mode, the support structure MT and the substrate table WT are kept essentially stationary, while an entire pattern imparted to the projection beam B is projected onto a target portion C at one time (i.e. a single static exposure). The substrate table WT is then shifted in the X direction and/or Y direction (i.e. a stepping direction) so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in a non-scanning direction) of the target portion C in a single dynamic exposure, whereas the length of the scanning motion determines the height (in a scanning direction) of the target portion C.

3. In another mode, the support structure MT is kept essentially stationary holding a programmable patterning device, and the substrate table WT is moved or scanned while a pattern imparted to the projection beam B is projected onto a target portion C. In this mode, generally a pulsed radiation source is employed as the source SO and the programmable patterning device is updated as required after each movement of the substrate table WT or in between successive radiation pulses during a scan. This mode of operation can be readily applied to maskless lithography that utilizes a programmable patterning device, such as a programmable minor array of a type as referred to above.

Combinations and/or variations on the above described modes of use or entirely different modes of use may also be employed.

Although specific reference may be made in this text to the use of a lithographic apparatus in the manufacture of integrated circuits, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate W can be classed into three general categories of immersion system. These include a bath type arrangement, a localized immersion system and an all-wet immersion system.

In the bath type arrangement, substantially the whole of the substrate W and optionally part of the substrate table WT is submersed in a bath of liquid.

The localized immersion system uses a liquid supply system in which liquid is only provided to a localized area of the substrate W. The area filled by liquid is smaller in plan than the top surface of the substrate W and the area filled with liquid remains substantially stationary relative to the projection system PS while the substrate W moves underneath that area. FIGS. 2-6 and 9-13 show different immersion systems which can be used as such a liquid supply system. A meniscus controlling feature can be present to seal liquid to the localized area. One way which has been proposed to arrange for this is disclosed in PCT patent application publication no. WO 99/49504. The meniscus controlling feature may be a meniscus pinning feature.

In the all wet arrangement, the liquid is unconfined. The whole top surface of the substrate W and all or part of the substrate table WT is covered in immersion liquid. The depth of the liquid covering at least the substrate W is small. The liquid may be a film, such as a thin film, of liquid on the substrate W Immersion liquid may be supplied to or in the region of the projection system PS and a facing surface facing the projection system PS (such a facing surface may be the surface of the substrate W and/or the substrate table WT). Any of the liquid supply devices of FIG. 2 or FIG. 3 can also be used in such a liquid supply system. However, a meniscus controlling feature is not present, not activated, not as efficient as normal or otherwise ineffective to seal liquid to only a localized area.

Figure 2:
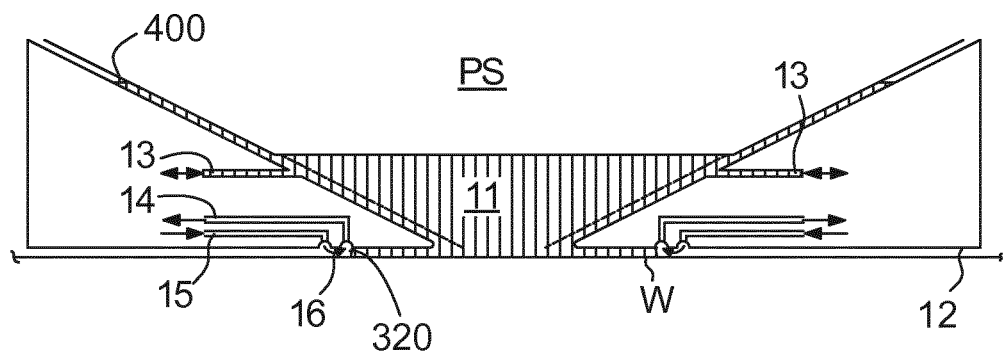
FIGS. 2 and 3 depict an immersion system for use in a lithographic projection apparatus.

FIG. 2 schematically depicts an immersion system (which can otherwise be referred to as a localized liquid supply system or fluid handling system) with a fluid handling structure 12 (which could also be referred to as a liquid confinement structure), which extends along at least a part of a boundary of a space 11 between a final element of the projection system PS and the substrate table WT or substrate W. (Please note that reference in the following text to surface of the substrate W also refers in addition or in the alternative to a surface of the substrate table WT, unless expressly stated otherwise.) In an embodiment, a seal is formed between the fluid handling structure 12 and the surface of the substrate W and which may be a contactless seal such as a gas seal 16 (such a system with a gas seal is disclosed in European patent application publication no. EP-A-1,420,298). The seal can be provided by a meniscus controlling feature.

The fluid handling structure 12 at least partly contains liquid in the space 11 between the final element of the projection system PS and the substrate W. The space 11 is at least partly formed by the fluid handling structure 12 positioned below and surrounding the final element of the projection system PS. Liquid is brought into the space 11 below the projection system PS and within the fluid handling structure 12 by opening 13. The liquid may be removed by opening 13. Whether liquid is brought into the space 11 or removed from the space 11 by the opening 13 may depend on the direction of movement of the substrate W and substrate table WT.

The liquid may be contained in the space 11 by the gas seal 16 which, during use, is formed between the bottom of the fluid handling structure 12 and the surface of the substrate W. The gas in the gas seal 16 is provided under pressure via inlet 15 to the gap between the fluid handling structure 12 and substrate W. The gas is extracted via a channel associated with outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure 12 and the substrate W contains the liquid in the space 11. Such a system is disclosed in United States patent application publication no. US 2004-0207824, which is hereby incorporated by reference in its entirety.

Figure 3:
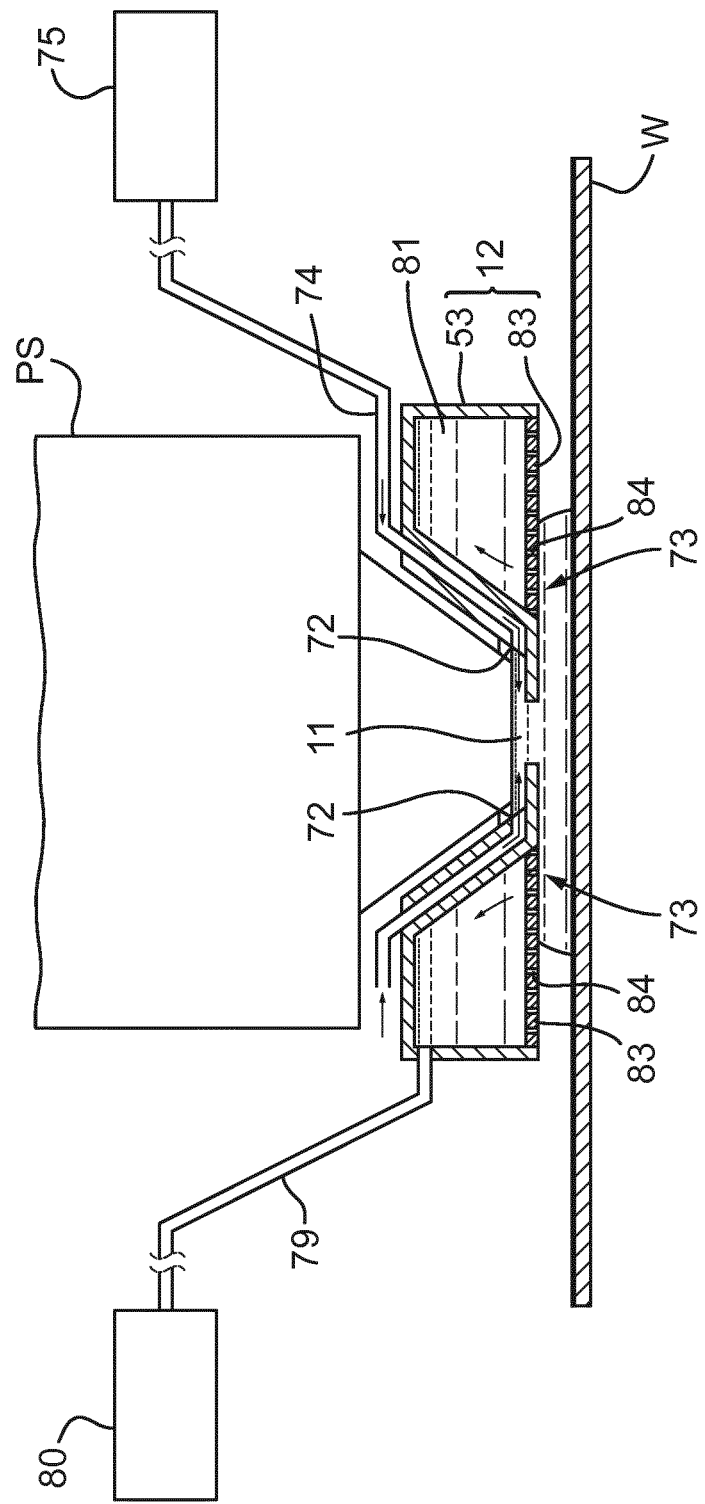

FIG. 3 is a side cross sectional view that depicts a further immersion system according to an embodiment. The arrangement illustrated in FIG. 3 and described below may be applied to the lithographic apparatus described above and illustrated in FIG. 1. The liquid supply system is provided with a fluid handling structure 12, which extends along at least a part of a boundary of a space 11 between the final element of the projection system PS and the substrate table WT or substrate W. (Please note that reference in the following text to surface of the substrate W also refers in addition or in the alternative to a surface of the substrate table WT, unless expressly stated otherwise.)

The fluid handling structure 12 at least partly contains liquid in the space 11 between a final element of the projection system PS and the substrate W. The space 11 is at least partly formed by the fluid handling structure 12 positioned below and surrounding the final element of the projection system PS. In an embodiment, the fluid handling structure 12 comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 23 through the passageway 29. The porous member 83 is disposed in the recovery port 73.

In an embodiment, to form the space 11 with the liquid between the projection system PS and the fluid handling structure 12 on one side and the substrate W on the other side, liquid is supplied from the supply ports 72 to the space 11 and the pressure in a recovery chamber 81 in the fluid handling structure 12 is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 between the projection system PS and the fluid handling structure 12 on one side and the substrate W on the other side.

Figure 4:
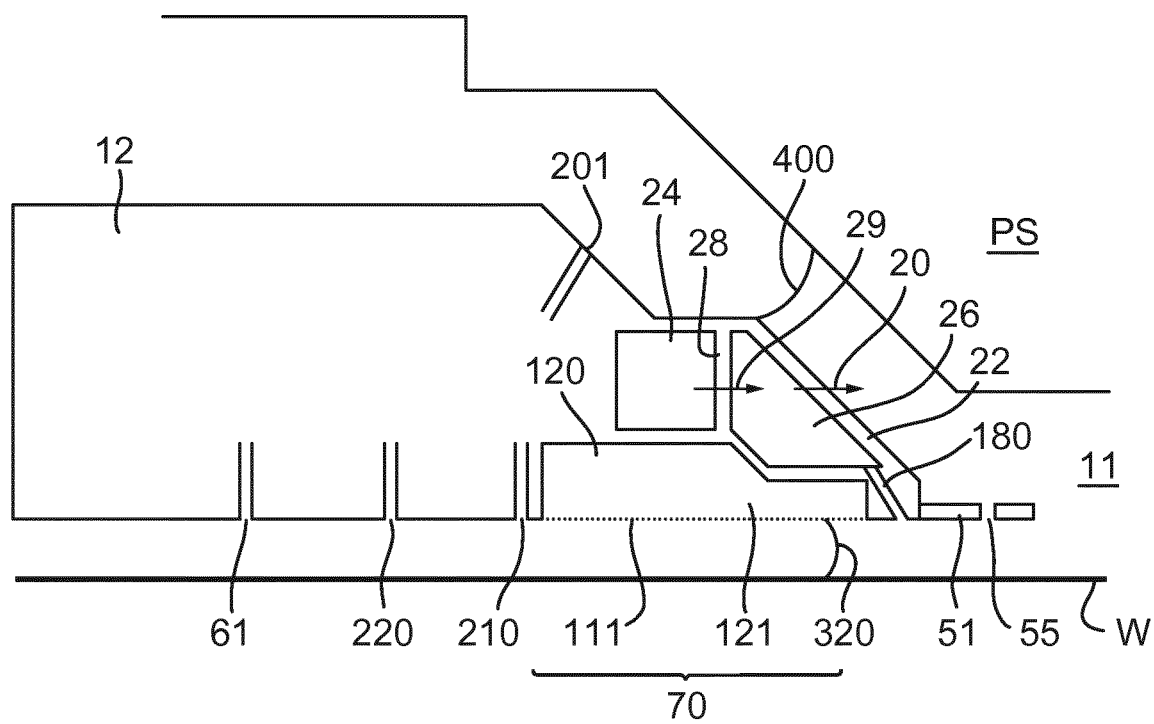
FIG. 4 depicts, in cross-section, a further immersion system for use in a lithographic projection apparatus.

FIG. 4 illustrates a fluid handling structure 12 which is part of an immersion system (such as a liquid supply system). The fluid handling structure 12 extends around the periphery (e.g. circumference) of the final element of the projection system PS. The fluid handling structure 12 is configured to contain immersion fluid to a region. The region may be external to the fluid handling structure 12. The region may be between the final element of the projection system PS and the substrate W and/or substrate table WT. The fluid handling structure 12 may comprise at least one meniscus controlling feature to contain the immersion fluid.

A plurality of openings 20 in the surface which in part defines the space 11 provide liquid to the space 11. The liquid passes through openings 29 and 20 in side walls 28 and 22 respectively, through respective chambers 24 and 26 respectively, prior to entering the space 11.

A seal is provided between the bottom of the fluid handling structure 12 and a facing surface, e.g. a top surface of the substrate W, or a top surface of the substrate table WT, or both. The facing surface is the surface facing the bottom of the fluid handling structure 12. In FIG. 4 a fluid handling structure 12 is configured to provide a contactless seal and is made up of several components. Radially outwardly from the optical axis of the projection system PS, there is provided a (optional) flow control plate 51 which extends into the space 11. The control plate 51 may have an opening 55 to permit liquid to flow therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12, facing (e.g., opposite) the facing surface may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus controlling feature.

Radially outwardly of the extractor assembly 70 is a gas knife. As depicted in FIG. 4, at least one gas knife opening 210 may be provided in a radially outward direction from the extractor assembly 70 to provide a gas knife. The gas knife openings 210 may be substantially parallel to the edge of the extractor assembly 70. In an embodiment, the gas knife opening 210 may be a series of discrete apertures provided along the edge of the extractor assembly 70. In use, the gas knife opening 210 is connected to an overpressure and forms a gas knife surrounding the meniscus controlling feature formed by the extractor assembly 70. The gas knife opening 210 may be adjacent to the meniscus controlling feature and is in a radially outward direction relative to the space 11 in plan view. An arrangement of the extractor assembly 70 and gas knife is disclosed in detail in United States patent application publication no. US 2006-0158627 incorporated herein in its entirety by reference.

In an embodiment, the extractor assembly 70 is a single phase extractor which may comprise a liquid removal device, extractor or inlet such as the one disclosed in United States patent application publication no. U.S 2006-0038968, incorporated herein in its entirety by reference. In an embodiment, the meniscus controlling feature comprises a micro-sieve. In an embodiment, the extractor assembly 70 comprises an inlet which is covered in a porous material 111 which is used to separate liquid from gas to enable single-liquid phase liquid extraction. The porous material 111 may also be a micro-sieve. An under pressure in chamber 121 is chosen is such that the meniscuses formed in the holes of the porous material 111 prevent ambient gas from being drawn into the chamber 121 of the extractor assembly 70. However, when the surface of the porous material 111 comes into contact with liquid there is no meniscus to restrict flow and the liquid can flow freely into the chamber 121 of the extractor assembly 70.

Although not specifically illustrated in FIG. 4, the fluid handling structure 12 may have an arrangement to deal with variations in the level of the liquid. This is so that liquid which builds up between the projection system PS and the fluid handling structure 12 can be dealt with and does not escape. One way of dealing with this liquid is to provide a lyophobic (e.g., hydrophobic) coating on at least part of the fluid handling structure 12.

Another localized immersion system with a fluid handling structure 12 makes use of a gas drag principle. The so-called gas drag principle has been described, for example, in United States patent application publication nos. US 2008-0212046, US 2009-0279060 and US 2009-0279062. In that localized immersion system the extraction holes are arranged in a shape which may desirably have a corner. The extractions holes may be used to provide a dual phase extractor. The corner may be aligned with a preferred direction of movement, such as the stepping direction or the scanning direction. This reduces the force on the meniscus between two openings in the surface of the fluid handing structure 12 for a given speed in the preferred direction compared to if the two openings were aligned perpendicular to the preferred direction. However, an embodiment of the invention may be applied to a fluid handling structure 12 which has any shape in plan, or has a component such as the outlets are arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star, for example, as depicted in FIG. 5.

Figure 5:
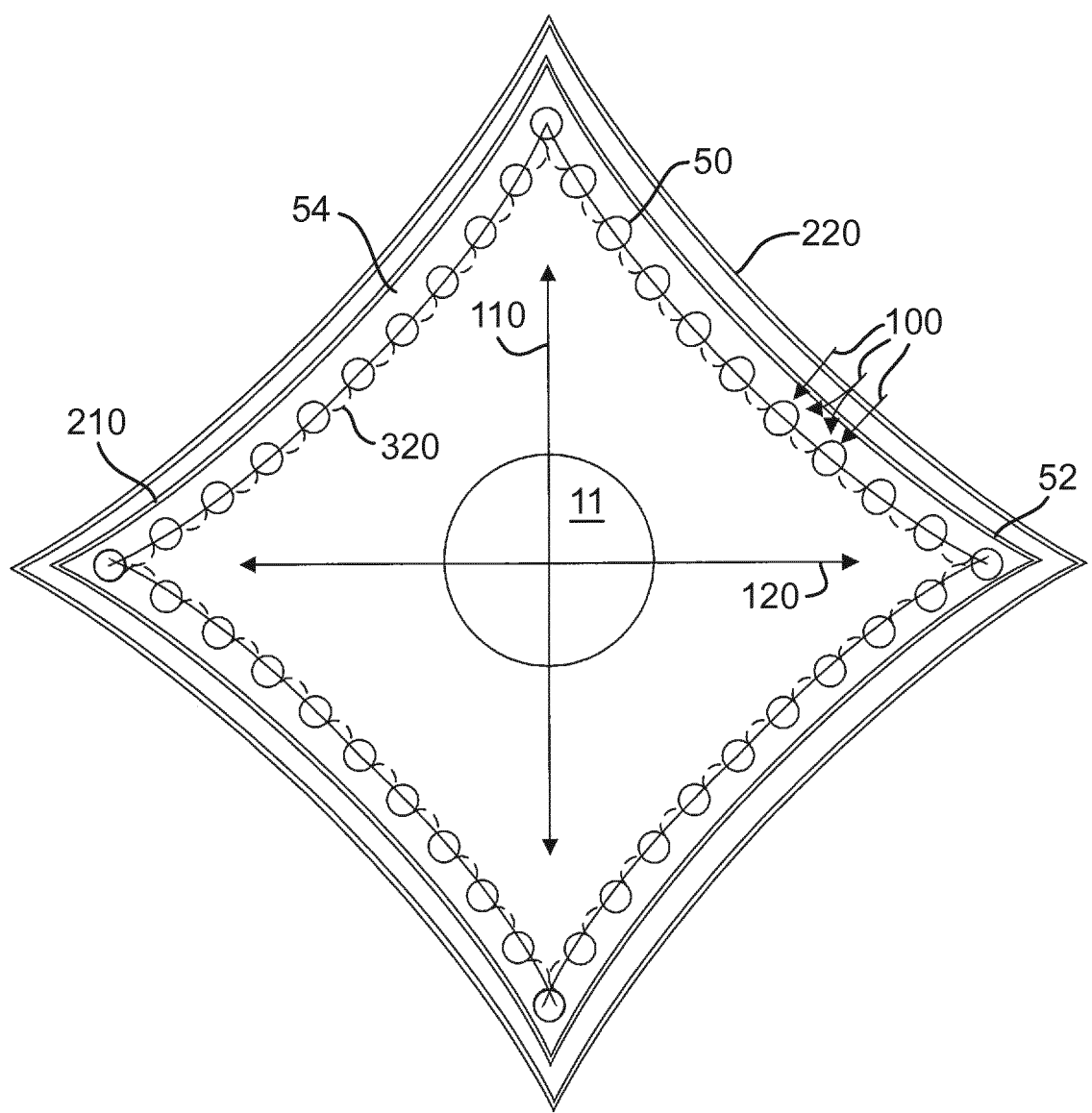
FIG. 5 depicts, in plan, an immersion system for use in a lithographic projection apparatus.

FIG. 5 illustrates schematically and in plan meniscus controlling features of an immersion system including a fluid handling structure 12 which may have outlets using the gas drag principle and to which an embodiment of the present invention may relate. The features of a meniscus controlling feature are illustrated which may, for example, replace the meniscus controlling features depicted by the gas seal 16, provided by the inlet 15 and the outlet 14 in FIG. 2, or at least the extractor assembly 70 shown in FIG. 4. The meniscus controlling feature of FIG. 5 is a form of extractor, for example a dual phase extractor. The meniscus controlling feature comprises a plurality of discrete openings 50. Each opening 50 is illustrated as being circular, though this is not necessarily the case. Indeed, the shape is not essential and one or more of the openings 50 may be one or more selected from: circular, elliptical, rectilinear (e.g. square, or rectangular), triangular, etc. and one or more openings may be elongate.

There may be no meniscus controlling features radially inwardly of the openings 50. The meniscus is pinned between the openings 50 with drag forces induced by gas flow into the openings 50. A gas drag velocity of greater than about 15 m/s, desirably about 20 m/s is sufficient. The amount of evaporation of liquid from the substrate W may be reduced, thereby reducing both splashing of liquid as well as thermal expansion/contraction effects.

Various geometries of the bottom of the fluid handling structure are possible. For example, any of the structures disclosed in U.S. patent application publication no. US 2004-0207824 or U.S. patent application Ser. No. 61/181,158, filed on 26 May 2009, could be used in an embodiment of the present invention.

As can be seen in FIG. 5, relative to the space 11, at least one gas knife opening 210 may be provided outside the openings 50 to provide a gas knife. The gas knife opening 210 may be substantially parallel to the lines joining the openings 50 of the meniscus controlling feature. In an embodiment the gas knife opening 210 may be a series of discrete apertures provided along a side 54 of the shape. In use, the gas knife opening 210 is connected to an over pressure and forms a gas knife (equivalent to the gas knife provided by gas knife openings 210 in FIG. 4) surrounding the meniscus controlling feature formed by openings 50. The gas knife opening 210 may be adjacent to the meniscus controlling feature and is in a radially outward direction relative to the space 11 in plan view.

The gas knife in an embodiment of the invention functions to reduce the thickness of any liquid film left on a facing surface, such as the substrate W or substrate table WT. The gas knife helps ensure that the liquid film does not break into droplets but rather the liquid is driven towards the openings 50 and extracted. In an embodiment the gas knife operates to prevent the formation of a film. To achieve this, it is desirable that the distance between the center lines of the gas knife and of the meniscus controlling openings 50 is in the range of from 1.5 mm to 4 mm, desirably from 2 mm to 3 mm. The line along which the gas knife is arranged generally follows the line of the openings 50 so that the distance between adjacent ones of the openings 50 and the gas knife opening 210 is within the aforementioned ranges. Desirably the line along which the gas knife opening 210 is arranged is parallel to the line of the openings 50. It is desirable to maintain a constant separation between adjacent ones of the openings 50 and the gas knife opening 210. In an embodiment this is desirable along the length of each center line of the gas knife. In an embodiment the constant separation may be in the region of one or more corners of the cornered shape.

Localized immersion systems such as those described above, with reference to FIGS. 2-5, can suffer from bubble inclusion into the space 11. As can be seen, a meniscus 320 extends between the fluid handling structure 12 and the facing surface (e.g. the top surface of the substrate W) under the fluid handling structure 12. This meniscus 320 illustrated in FIG. 2 and FIG. 4 defines the edge of the space 11. When the meniscus 320 and a droplet collide on the surface, for example a droplet of liquid which has escaped the space 11, a bubble of gas may be included into the space 11. Inclusion of a bubble into the space 11 is detrimental because a bubble of gas can lead to an imaging error.

There are certain circumstances in which it is more likely that a droplet will be left behind on the surface. For example, a droplet may be left behind on the surface when the immersion system (and particularly the fluid handling structure 12) is located over the edge of a substrate W when there is relative movement between the immersion system/fluid handling structure 12 and the substrate W. In another example, a droplet may be left behind when the immersion system (and particularly the fluid handling structure 12) is located over a step change in height of the facing surface facing the fluid handling structure 12 and when there is relative movement between the fluid handling structure 12 and the facing surface. In another example, a droplet may be left behind due to a relative speed between the fluid handling structure 12 and the facing surface being too high, for example when the meniscus becomes unstable, e.g. by exceeding the critical scan speed of the facing surface. A bubble may be included into the space 11 at the meniscus 400 illustrated in FIGS. 2 and 4 extending between the fluid handling structure 12 and the projection system PS. Here a bubble of gas could be created by liquid supplied from a liquid inlet (e.g. inlet 13 in FIG. 2 and inlet 20 in FIG. 4) on a radially inward facing surface of the fluid handling structure 12 entraining gas from between the projection system PS and the fluid handling structure 12.

Ways of dealing with the difficulty of bubble inclusion have concentrated on improving the confinement properties of the fluid handling structure 12. For example, the relative speed between the fluid handling structure 12 and the facing surface has been decreased in order to avoid spilling of liquid.

Very small bubbles of gas may dissolve in the immersion liquid before they reach the exposure area of the space 11. An embodiment of the present invention uses the fact that dissolution speed is dependent upon the type of the trapped gas and the immersion liquid properties.

A bubble of carbon dioxide gas typically dissolves faster than a bubble of air. A bubble of $CO_2$, which has a solubility fifty-five (55) times larger than that of nitrogen and a diffusivity of 0.86 times that of nitrogen, will typically dissolve in a time thirty-seven (37) times shorter than the time for a bubble of the same size of nitrogen to dissolve. Supplying $CO_2$ adjacent to the meniscus 320 or 400 means that a bubble of $CO_2$ gas will dissolve into the immersion liquid much faster than if other gases with lower diffusivity were used. Therefore, using $CO_2$ in the present invention will reduce the number of imaging defects thereby allowing higher throughput (e.g., higher speed of the substrate W relative to the fluid handling structure 12) and lower defectivity.

Therefore, the present invention may provide a gas knife which supplies substantially pure $CO_2$ gas to a region (e.g. to a volume, or a towards an area) adjacent to the space 11. In particular, $CO_2$ gas is provided such that it is present in the region adjacent to the meniscus 320 extending between the facing surface (e.g. on substrate W or substrate table WT) and the fluid handling structure 12.

Carbon dioxide is desirable because it is readily available and may be used in immersion systems for other purposes. Carbon dioxide has solubility in water at 20° C. and 1 atm total pressure of $1.69 \times 10^{-3}$ kg/kg or $37 \times 10^{-3}$ mol/kg. Other gases may have one or more disadvantages, for example, other gases may react with components in the immersion lithographic apparatus and/or may be poisonous and may therefore be harder to handle and less desirable than carbon dioxide.

By using gaseous $CO_2$ the problem associated with the meniscus 320 colliding with a droplet of liquid may be reduced. Typically a droplet of 300 micrometers would produce a bubble of 30 micrometers in diameter (i.e. a tenth the size). Such a bubble of carbon dioxide would usually dissolve in the immersion liquid before reaching the exposure area which may make problems caused by a droplet less significant. Therefore, an immersion system may be more tolerant of interacting with immersion liquid which had escaped from the space 11.

Carbon dioxide gas is also provided through at least one gas supply opening 220. The gas supply opening 220 is radially outward, i.e. in a radially outward direction in plan view relative to the space 11, of the gas knife opening 210 (and also the meniscus controlling feature, such as the extractor 70 in FIG. 4 or the outlets 50 in FIG. 5). The at least one gas supply opening 220 may be adjacent to the at least one gas knife opening 210, as depicted in FIGS. 4, 5, 6, 10, 11, 12 and 13.

Providing a gas knife opening 210 for providing substantially pure $CO_2$ gas and a gas supply opening 220 for providing substantially pure $CO_2$ gas means that an atmosphere of substantially pure $CO_2$ can be provided adjacent to and radially outward of the space 11. The atmosphere adjacent to, and radial outward of, the space 11 does not contain significant amounts of gases which do not dissolve as readily as $CO_2$ gas.

In the present invention herein described, a substantially pure $CO_2$ gas atmosphere is formed around the meniscus 320 of immersion liquid so that any inclusion of $CO_2$ gas into the immersion liquid creates a gas inclusion which dissolves in the immersion liquid. In an embodiment, the atmosphere of substantially pure $CO_2$ gas is at least 90% $CO_2$ gas. In an embodiment, the atmosphere of substantially pure $CO_2$ gas is at least 95% $CO_2$ gas. In an embodiment, the atmosphere of substantially pure $CO_2$ gas is at least 99% $CO_2$ gas. In an embodiment, the atmosphere of substantially pure $CO_2$ gas is at least 99.5% $CO_2$ gas. In an embodiment, the atmosphere of substantially pure $CO_2$ gas is at least 99.9% $CO_2$ gas. It is preferable that the substantially pure $CO_2$ gas atmosphere has as high a $CO_2$ gas content as is achievable.

A difficulty with providing carbon dioxide gas in a lithographic apparatus is that some components, for example components of a position measurement system of the substrate table WT, have impaired performance in a carbon dioxide atmosphere. In the present invention, it is ensured that a pure carbon dioxide environment is present near the meniscus 320 during scanning To achieve this, it may be necessary, for example in the embodiment of FIG. 5, to have a flow rate of carbon dioxide out of the gas knife opening 210 and the gas supply opening 220 greater than the amount of $CO_2$ extracted through the openings 50. This may result in an excess of carbon dioxide leaking out from under the fluid handling structure 12 into the environment of the machine and particularly towards components of a position measurement system of the substrate table WT.

Figure 6:
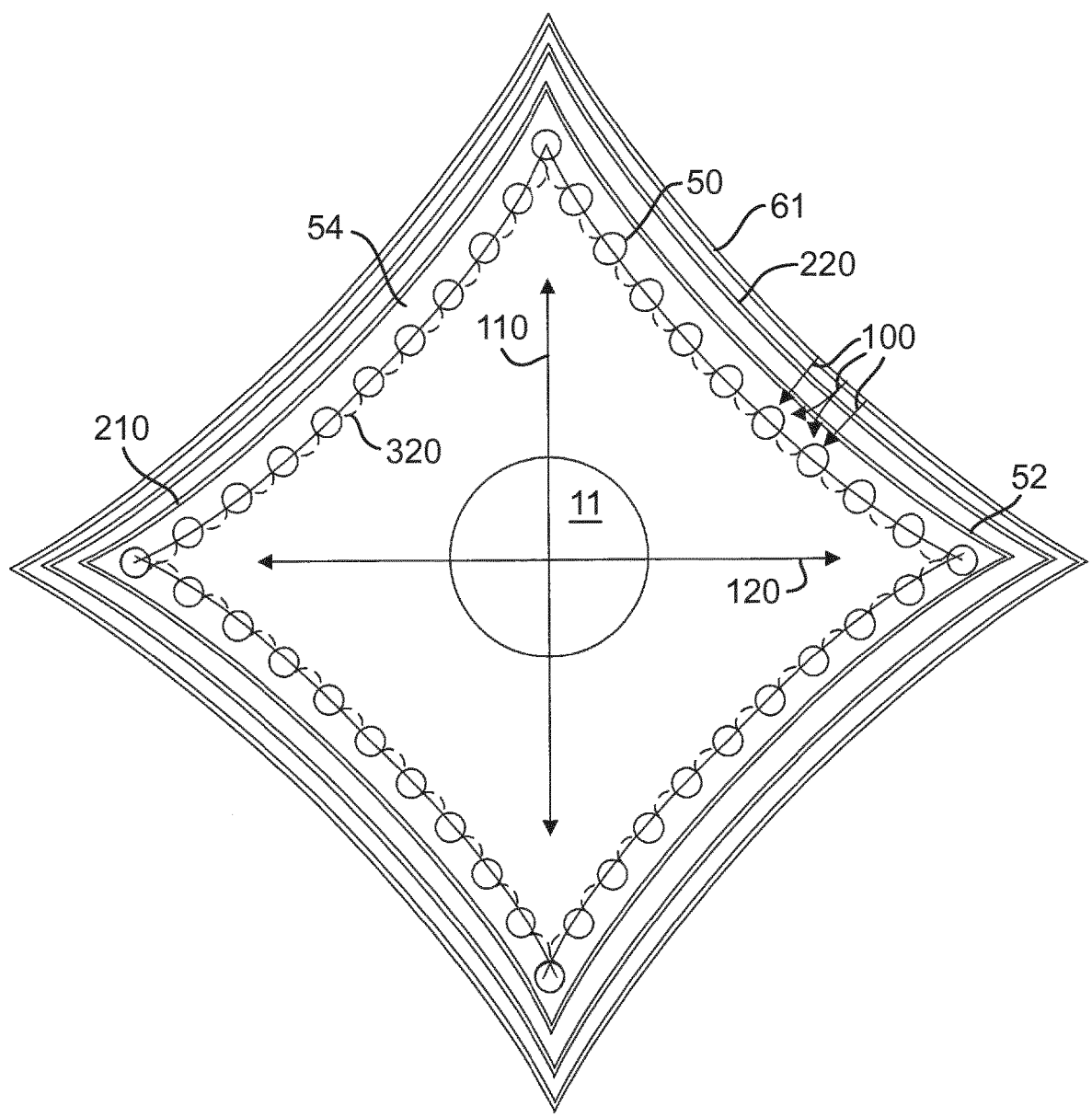
FIG. 6 depicts, in plan, an immersion system for use in a lithographic projection apparatus.

In an embodiment of the invention, in order to ensure that excess carbon dioxide does not leak from under the fluid handling structure 12, at least one gas recovery opening 61 is provided radially outward of the one or more meniscus controlling features, the gas knife opening 210 and the gas supply opening 220 as depicted in FIG. 6. The gas recovery opening 61 may be provided with any of the embodiments. The gas recovery opening 61 may comprise a dual phase extractor. As an example, the dual phase extractor may have an extraction flow rate of approximately 40 to 80 Nl/min, however, this may vary depending on the apparatus. In this way an environment of carbon dioxide can still be provided radially outwardly of the meniscus controlling features thereby reducing bubble inclusion to the space 11. Also, possible contamination or interruption of functioning of components of the lithographic apparatus can be reduced or prevented.

Figure 7:
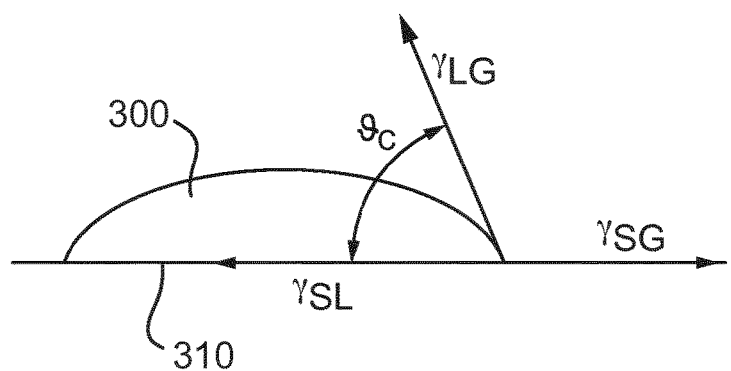
FIG. 7 illustrates, in cross-section, the forces acting on a droplet on a surface which result in a particular contact angle.

An advantage of providing an atmosphere of substantially pure carbon dioxide adjacent to the meniscus 320 is that the carbon dioxide may then dissolve in immersion liquid at the meniscus 320 under the openings 50 of the meniscus controlling feature. This results in the immersion liquid at the meniscus 320 becoming slightly acidic (a decrease in pH). If the immersion liquid becomes more acidic this increases the presence of $H_3O^+$ ions. An increase in the number of $H_3O^+$ ions results in the solid-liquid surface energy ($\gamma_{SL}$) decreasing. The solid-gas surface energy ($\gamma_{SG}$) does not change and neither does the liquid-gas surface energy ($\gamma_{LG}$). The change in the solid-liquid surface energy therefore affects the equilibrium between the three surface energies. The surface tension in the liquid meniscus, especially towards its interface with the solid surface, is affected. The change in direction of the surface tension as a consequence of the change in the surface energies is illustrated in FIG. 7. FIG. 7 shows the contact angle $\theta_C$ of the droplet 300 on the surface 310. The relationship between the three surface energies and the contact angle is given in the following equation:

$$\gamma_{LG}\cos\theta_C = \gamma_{SG} - \gamma_{SL}$$

According to this equation a decrease in the solid-liquid electrical surface energy ($\gamma_{SL}$) results in an increase in the contact angle $\theta_C$. An increase in the contact angle $\theta_C$ between liquid and the facing surface, particularly at the meniscus 320, results in an improvement in performance of the meniscus controlling feature (e.g. the openings 50). As such, a higher velocity between the fluid handling structure 12 and the facing surface may be achieved before liquid is lost from the immersion space 11, beyond the meniscus controlling feature.

Figure 8:
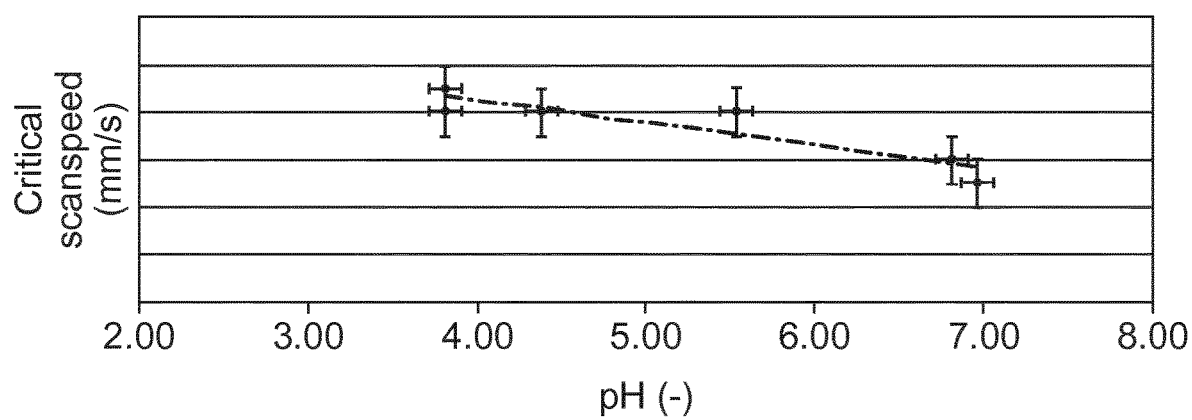
FIG. 8 is a graph of critical scan speed versus pH of immersion liquid.

FIG. 8 is a graph showing the pH of immersion liquid along the x axis and the critical scanning speed before liquid loss along the y axis. The graph is for a particular type of fluid handling structure and a substrate W having a top coat of TCX041 available from JSR Micro, Inc. in Calif., US.

FIG. 8 shows that a reduction in pH of immersion liquid leads to an increase in critical scan speed. An increase in critical scan speed would lead to an increase in throughput as a high scan speed can be used without risk of liquid loss (which can lead to imaging errors as described above). This is particularly so for larger substrates W such as substrates with a diameter of 450 mm This is because on such a larger substrate, relative to a smaller substrate, more scans are performed a distance away from the edge of the substrate W, for example in a region towards the center of the substrate W. It is the scans in a region towards the center of the substrate W which can be performed close to critical scan speed; whereas scans performed closer to the edge of a substrate W may need to be performed at a slower speed than the critical scan speed. The reason for this difference in scan speed can be, for example, the effect of the edge of the substrate W on the stability of the meniscus 320.

Providing a gas supply opening 220 radially outwards of the gas knife opening 210 may ensure that an atmosphere of substantially pure $CO_2$ gas is provided adjacent to the space 11, i.e. adjacent to the meniscus 320. If such a gas supply opening 220 was not provided, then to provide the substantially pure $CO_2$ gas atmosphere adjacent to the meniscus 320, the flow rate of the substantially pure $CO_2$ gas supplied by the gas knife opening would have to be much higher, and more water marks would occur due to the higher flow rate. For example, a gas knife opening without an additional gas supply opening 220 may have to provide gas at a flow rate approximately 10-20 Nl/min more than the extracted gas flow rate by the dual phase extractor. If there is no gas supply opening 220 and the gas knife flow rate is kept low to avoid water marks, then bubbles that enter the immersion liquid in the space 11 would take longer to dissolve. Hence more imaging errors would occur.

However, in the present invention, a gas supply opening 220 provides $CO_2$ gas radially outward of the gas knife opening 210. Therefore, if gas external to the gas knife is drawn into the atmosphere adjacent to the meniscus 320, the gas is likely to be substantially pure $CO_2$ gas emitted by the gas supply opening 220, such that the atmosphere adjacent to the meniscus 320 can be maintained as substantially pure $CO_2$. Therefore, the flow rate and/or the gas velocity, of the gas knife can be reduced because it is not necessary to prevent gas radially outward of the gas knife from entering the atmosphere adjacent to the space 11, because the gas radially outward of the gas knife opening is also $CO_2$. As such, the substantially pure $CO_2$ gas atmosphere can be maintained when the gas emitted from the gas knife opening 210 is at a lower flow rate.

The gas knife has a first gas velocity at which the $CO_2$ gas exits the gas knife opening 210. The gas supply opening 220 has a second gas velocity at which substantially pure $CO_2$ gas exits the at least one gas supply opening 220. In an embodiment, the first gas velocity is greater than the second gas velocity. In an embodiment, the second gas velocity may be equal to or less than approximately the dual extraction gas velocity.

The gas knife has a first flow rate at which the $CO_2$ gas exits the gas knife opening 210. In an embodiment, first flow rate is less than approximately 30 Nl/min more than the extracted gas rate by the dual phase extractor. In an embodiment, the first flow rate is preferably less than approximately 15 Nl/min more than the extracted gas rate by the dual phase extractor. In an embodiment, the first flow rate is preferably no more than the extracted gas flow rate by the dual phase extractor. The gas supply opening 220 has a second flow rate at which substantially pure $CO_2$ gas exits the at least one gas supply opening 220. In an embodiment, the first flow rate is greater than the second flow rate. In an embodiment, the second flow rate may be equal to or less than approximately the dual extraction flow rate. In an embodiment, the second flow rate is generally between 10-60 Nl/min Generally, $CO_2$ gas which is provided at the atmosphere adjacent to the meniscus 320 may be humidified at high pressure. A gas knife, such as the gas knife opening 210, provides a flow of gas which results in a pressure peak on the facing surface (e.g. substrate W). The gas knife has high stagnant pressure. Due to the high pressure change across the gas knife, i.e. a high pressure gradient, the pressure drop leads to a reduction in the relative humidity of the carbon dioxide in the atmosphere adjacent to the meniscus 320. By using a gas supply opening 220 in addition to the gas knife opening 210 as described above, the flow rate and/or the gas velocity, at which $CO_2$ gas is provided from the gas knife opening 210 is reduced (compared to when a gas substrate opening 210 is provided) and therefore, the pressure drop across the gas knife is reduced also. The flow of gas from the gas supply opening is generally a low impulse gas supply. Therefore, the reduction of relative humidity of the gas across the gas knife is reduced, such that there is a lower heat load on the substrate W.

In an embodiment, the gas knife opening 210, the gas supply opening 220 and, if provided, the gas recovery opening 61 are provided on the lower surface of the fluid handling structure 12 and are at the same distance with respect to the facing surface.

In an embodiment, the distances between each of the openings and the facing surfaces are variable. For example, a step may be provided between the gas knife opening 210 and the gas supply opening 220 such that the gas knife opening 210 is closer to the facing surface than the gas supply opening 220 (and the gas recovery opening 61 if included). Alternatively, the gas knife opening 210 may be further away from the facing surface than the gas supply opening 220 (and the gas recovery opening 61, if provided). Additionally, or alternatively, a step may be provided between the gas supply opening 220 and the gas recovery opening 61 such that the gas supply opening 220 is closer to the facing surface than the gas recovery opening 61. Alternatively, the gas supply opening 220 may be further from the facing surface than the gas recovery opening 61.

In an embodiment, the distance between the openings and the facing surface can be chosen to control the speed of the $CO_2$ gas on the facing surface, i.e. an increase in distance between an opening and the facing surface will decrease the speed of gas on the facing surface. In general, the velocity of a jet starts decreasing after a distance from the opening of approximately four times the diameter of the opening. This distance may be for example, approximately 150-200 micrometers. At 350 micrometers the velocity of the jet, and the resulting pressure on the facing surface, is significantly decreased. Having a high pressure at the facing surface may mean that the overall number and/or size of droplets radially outward of the meniscus 320 is reduced, however, resulting water marks on the substrate W may be made. Therefore, the supply of gas through the gas supply opening 220 and the gas knife opening 210 can be optimised in accordance with the height of the openings above the facing surface to reduce the water marks.

The gas knife opening 210 and the gas supply opening 220 each have a surface area on the lower surface of the fluid handling structure 12. The overall surface area of the gas knife opening 210 may be smaller than the overall surface area of the gas supply opening 220. The gas emitted from the gas knife opening 210 is at a first flow speed and the gas emitted from the gas supply opening 220 is at a second flow speed. In an embodiment, the first flow speed is greater than the second flow speed. In an embodiment, at least one gas recovery opening 61 may be provided radially outward of the gas supply opening 220, as depicted in FIGS. 4 and 6. However, this is not necessarily the case. For example, in the embodiment of FIG. 9 described below, the at least one gas recovery opening 61 is provided radially inwardly of the gas supply opening 220.

In an embodiment, the gas supply opening 220 and/or gas recovery opening 61 may be provided as a single slit or as a plurality of discrete openings.

In an embodiment, the gas recovery opening 61 at least partly surrounds the gas supply opening 220. It may not be possible for the gas recovery opening 61 to completely surround the gas supply opening 220. In an embodiment the gas recovery opening 61 surrounds the majority of the perimeter of the gas supply opening 220. In an embodiment the gas recovery opening 61 may surround at least half of the perimeter. That said, in an embodiment the gas recovery opening 61 may substantially completely surround the perimeter of the gas supply opening 220. A high extraction rate out of the gas recovery opening 61 (for example connecting a large underpressure source to the gas recovery opening 61) at least partly mitigates for the fact that the at least one gas recovery opening 61 does not completely surround the gas supply opening 220.

In an embodiment depicted in FIG. 4, the at least one gas recovery opening 61 is formed in the fluid handling structure 12. In one embodiment the at least one gas recovery opening 61 is formed in an undersurface of the fluid handling structure 12. In one embodiment the at least one gas recovery opening 61 is formed in a bottom surface of the fluid handling structure 12. In one embodiment, the gas recovery opening 61 is formed in the same surface in which the gas knife opening 210 and the gas supply opening 220 are formed. The flow of gas out of the gas supply opening 220 and the gas knife opening 210 is both radially inward towards the meniscus 320 and radially outward.

In an embodiment the radially outward flow is greater than the inward flow. This ensures that there is minimal or no flow of gas radially inward from outside the fluid handling structure 12 reaching the meniscus 320. If the radially outward flow from the gas supply opening 220 and the gas knife opening 210 is too low, this could have the effect of sucking in gas from the outside of the fluid handling structure 12.

The embodiments of FIG. 5 and FIG. 6 are the same as that of FIG. 4 concerning the gas supply opening 220 and the gas knife opening 210. The gas recovery opening 61, for example, as depicted in FIG. 4, FIG. 6 and FIG. 9, is not essential.

Figure 9:
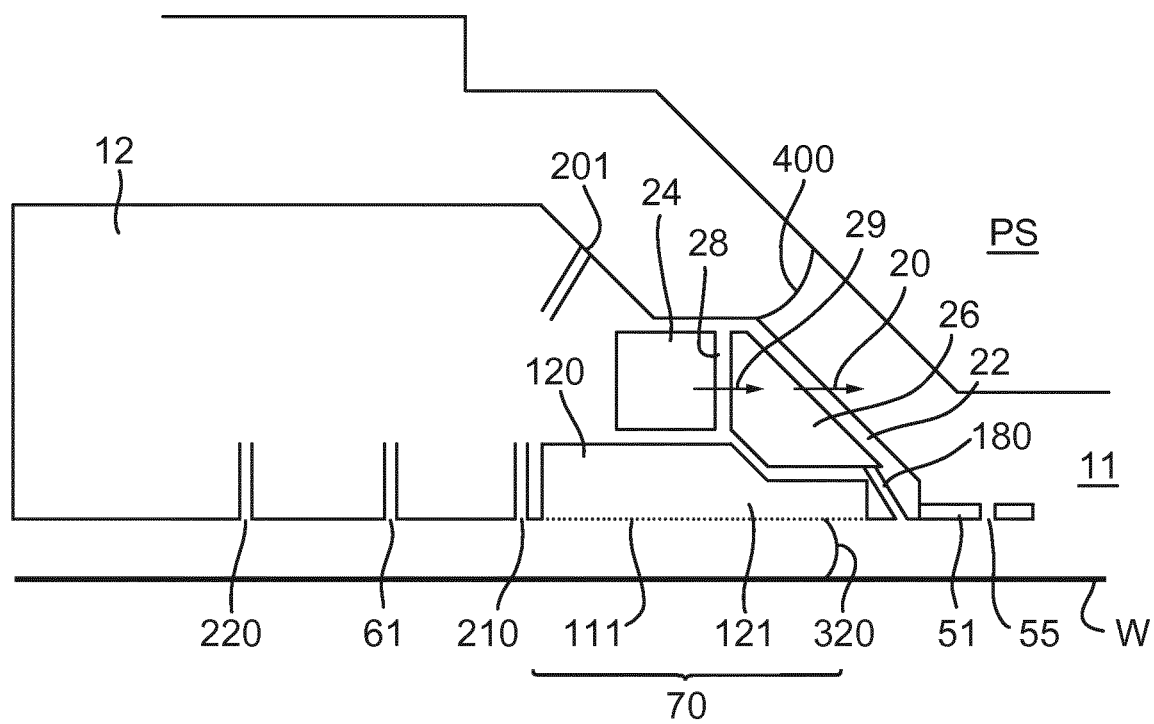
FIG. 9 depicts, in cross-section, a further immersion system for use in a lithographic projection apparatus.

The embodiment of FIG. 9 is the same as the embodiment of FIG. 4 except as described below. In the embodiment of FIG. 9 the at least one gas recovery opening 61 is radially outward of the gas knife opening 210 and radially inward of the gas supply opening 220. The gas supply opening 220 is radially outward of the at least one gas recovery opening 61. The gas knife opening 210 is radially inward of the recovery opening 61 and the gas supply opening 220. Optionally, there may be an additional gas recovery opening (not shown) radially outwards of the gas supply opening 220. Such an additional gas recovery opening would help reduce or avoid $CO_2$ gas from leaking into the atmosphere around the lithographic apparatus.

Because the gas exiting the gas knife opening 210 is carbon dioxide, that gas has a higher kinetic energy than gas comprising air at the same velocity. This is because the density of carbon dioxide is higher than that of air.

The escape of carbon dioxide into the environment of the lithographic apparatus is reduced by collecting the carbon dioxide, radially outwardly of the gas knife opening 210, through the gas recovery opening 61.

In all of the embodiments of FIG. 4, FIG. 6 and FIG. 9, the at least one gas recovery opening 61 is provided in the fluid handling structure 12 itself. In an embodiment the at least one gas recovery opening 61 is provided in a separate component.

An advantage of using $CO_2$ in the embodiments is that the potential danger of providing an explosive vapour or liquid is reduced by the presence of carbon dioxide.

In an embodiment an immersion system for an immersion lithographic apparatus is provided. The immersion system comprises a fluid handling structure 12 of any of the above embodiments and a gas supply system configured to supply gas to the gas supply opening 220 and the gas knife opening 210. The gas supplied by the gas supply system is carbon dioxide.

Figure 10:
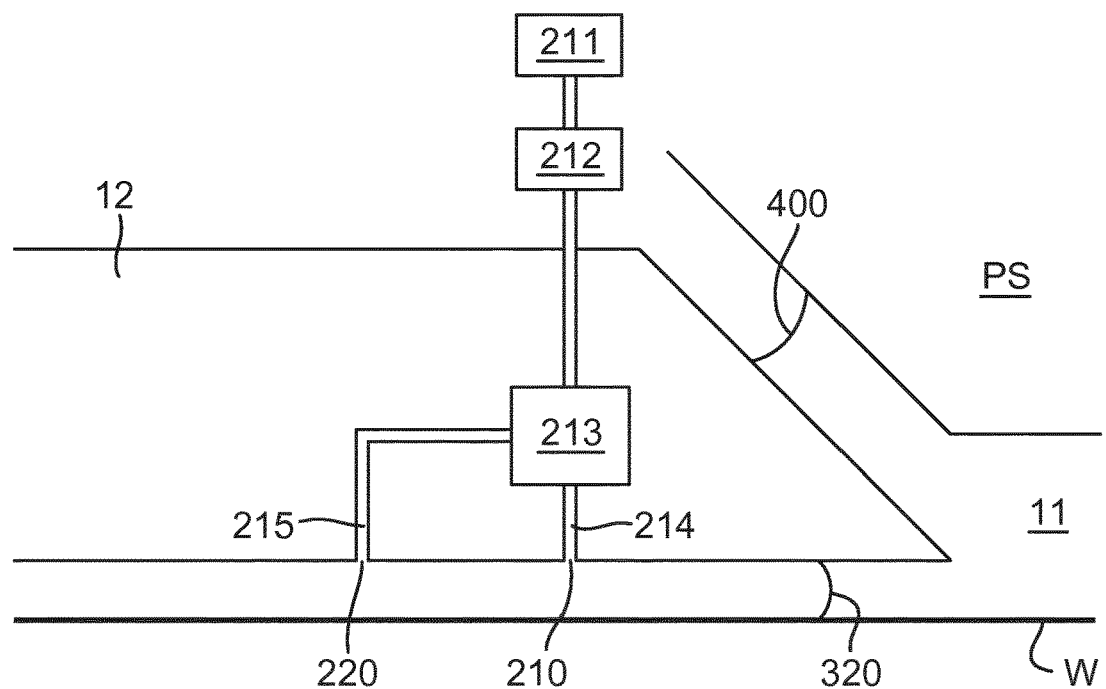
FIG. 10 depicts, in cross-section an immersion system for use in a lithographic apparatus.
Figure 11:
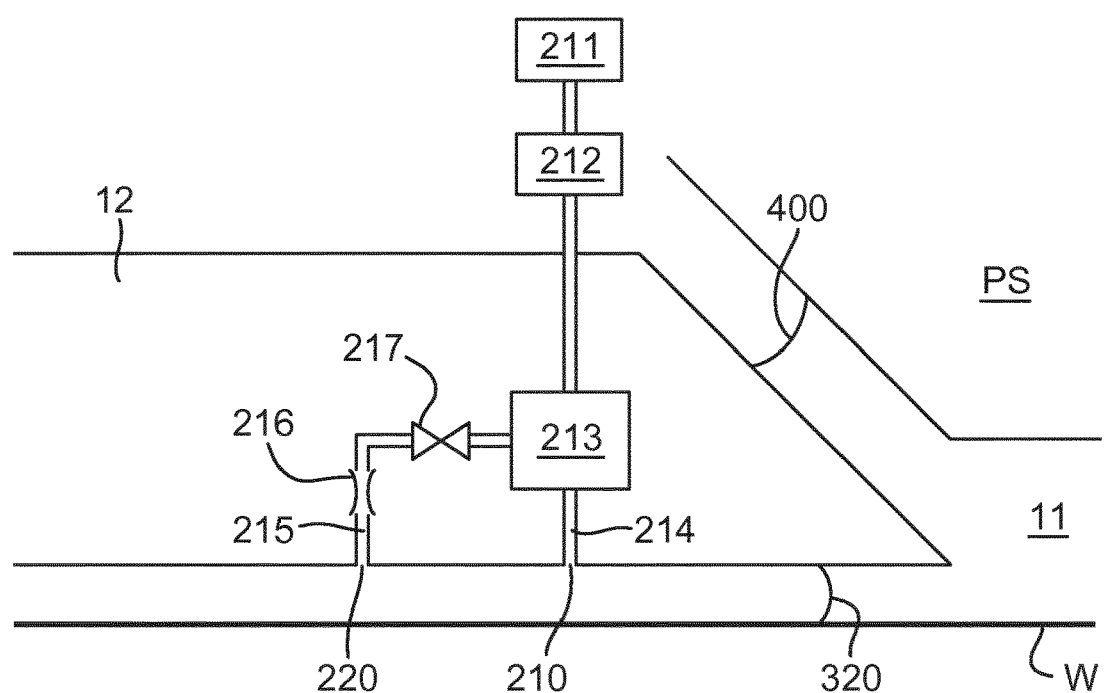
FIG. 11 depicts, in cross-section an immersion system for use in a lithographic apparatus.

In an embodiment, the gas supply system comprises a gas source 211 to provide gas to the at least one gas knife opening 210 and the at least one gas supply opening 220. In an embodiment, the same gas source 211 is used to provide gas to the at least one gas knife opening 210 and the at least one gas supply opening 220, as depicted in FIG. 10. In an embodiment, the gas supplied to the gas supply opening 220 may be controlled using a valve 217, as depicted in FIG. 11, to redirect gas from the gas knife opening 210 to the gas supply opening 220. Using a valve 217 to control the gas supply to the gas supply opening 220 means that the flow rate and/or gas velocity of the gas being emitted from the gas supply opening 220 and the gas knife opening 210 may be more easily controlled, e.g. the flow rate and/or gas velocity of the gas emitted from the gas knife opening 210 and the gas supply opening 220 may be set to selected predetermined values or altered to selected values. The valve 217 is depicted as part of the fluid handling structure 12, however, the valve 217 may be outside the fluid handling structure 12. For example, the valve 217 may be connected to or integral with, the gas source 211 or the humidifier 212.

Figure 12:
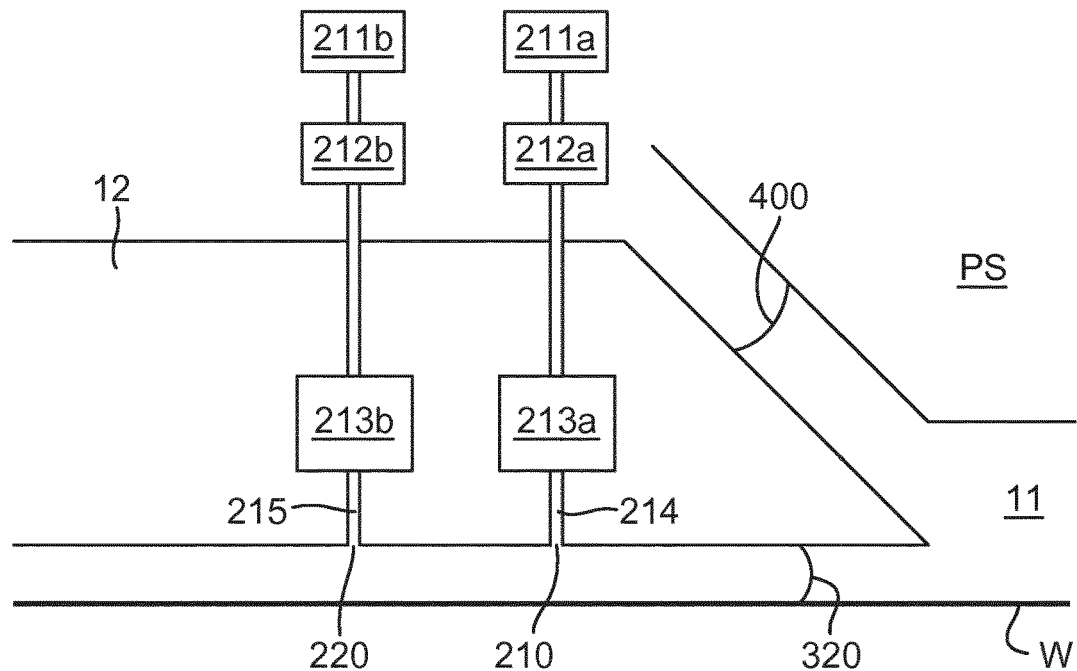
FIG. 12 depicts, in cross-section an immersion system for use in a lithographic apparatus.

In an embodiment, the gas supply system comprises multiple gas sources. In an embodiment, a first gas source 211a is used to provide gas to the at least one gas knife opening 210 and a second gas source 211b is used to provide gas to the at least one gas supply opening 220, as depicted in FIG. 12. Using different gas sources to supply gas to the gas knife opening 210 and the gas supply opening 220 means that the flow rate and/or gas velocity of the gas being emitted from the gas supply opening 220 and the gas knife opening 210 may be more easily controlled. In an embodiment, the gas supply system comprises multiple gas sources and a third path 218 between a first path 214 and a second path 215 to redirect gas to or from the gas knife opening 210 from or to the gas supply opening 220 respectively. The amount of gas being redirected may be dynamically controlled using a valve 219, as depicted in FIG. 12. The gas supply opening 220 and the gas knife opening 210 depicted in FIGS. 10, 11, 12 and 13 may be used in any of the embodiments, for example, in combination with, and radially outward of, a meniscus controlling feature of any of the above embodiments.

In an embodiment, gas is supplied to the gas knife opening 210 from the gas source 211 via the first path 214. In an embodiment, gas is supplied to the gas supply opening 220 from the gas source 211 via the second path 215. In an embodiment, the first path 214 and the second path 215 may be joined together on one path between the gas source 211 and the gas knife opening 210 and the gas supply opening 220, for example, as depicted in FIG. 10. In this embodiment, the first flow speed and the second flow speed may be more or less the same. The first flow speed and the second flow speed may be altered relative to each other. This may be done in several ways, for example, by providing different shaped flow paths and/or having different surface areas for the gas knife opening 210 and the gas supply opening 220.

The gas knife opening 210 and the gas supply opening 220 are separate. This means that even if they are supplied by the same gas source 211, the flow rate and/or gas velocity of gas exiting each of the gas knife opening 210 and the gas supply opening 220 can be controlled. Therefore, the flow of gas from the gas knife opening 210 and the gas supply opening 220 can be optimized In an embodiment, the gas supply system comprises a humidifier 212 to control the humidity of the gas provided by at least one of the gas sources. In an embodiment, the gas is substantially pure $CO_2$ gas and is humidified $CO_2$ gas. In an embodiment, the humidifier 212 increases the humidity of the $CO_2$ gas provided by at least one of the gas sources. In an embodiment, a humidifier 212 is connected to a gas source 211 as depicted in FIG. 1 and FIG. 10. In an embodiment, the gas supply system comprises multiple humidifiers. In an embodiment, a humidifier may be connected to each gas source, for example, as depicted in FIG. 11. FIG. 11 shows a first humidifier 212a connected to a first gas source 211a and a second humidifier 212b connected to a second gas source 211b. In an embodiment, the humidifier 212 may be part of the fluid handling structure 12. In an embodiment, the humidifier 212 may not be included in the immersion system of the gas supply system, i.e. the humidifier 212 is not essential.

In an embodiment, the fluid handling structure 12 may comprise a reservoir 213. The reservoir may be between the at least one gas supply system and the gas knife opening 210 and the gas supply opening 220. In an embodiment, the reservoir 213 may be a section between the gas supply system and at least one of the gas knife opening 210 and the gas supply opening 220 which has an increased cross-sectional area. In an embodiment, the fluid handling structure 12 may comprise the first path 214 from the reservoir 213 to the gas knife opening 210 and the second path 215 from the reservoir 213 to the gas supply opening 220. In an embodiment, the reservoir 213 may not be provided, i.e. the reservoir 213 is not essential.

Providing a reservoir 213 allows greater control of the gas being omitted from the gas knife opening 210 and/or the gas supply opening 220. For example, the gas may build up in the reservoir 213 and may be more uniformly distributed from the gas knife opening 210 and the gas supply opening 220 in plan view, for example as depicted in FIG. 4. Providing a humidifier 212 allows greater control of the gas being omitted from the gas knife opening 210 and/or the gas supply opening 220. For example, the humidity of the gas being supplied to the gas knife opening 210 and/or the gas supply opening 220 can be controlled to affect the humidity of the gas atmosphere adjacent to the meniscus 320.

In an embodiment, the second path 215 between the gas source 211 and the at least one gas supply opening 220 may comprise a flow restrictor section to reduce the flow rate and/or gas velocity of gas being omitted from the gas supply opening 220. The flow restrictor section may be a bend and/or reduction in the flow-through area in the second path 215. An example of a bend in the second path 215 is depicted in FIG. 10. A schematic example of a reduction in flow-through area 216 is depicted in FIG. 11. The flow velocities can be altered and tuned to optimize the gas flow through each of the gas knife opening 210 and the gas supply opening 220. The flow velocities can be controlled by selecting the cross-sectional areas of the first path 214 and the second path 215 and providing reductions in the cross-sectional area of the second path 215. As such, the ratio of gas passing through the first path 214 and the second path 215 can be controlled.

The surface area of the openings can be selected to help control the speed at which the gas (e.g. $CO_2$) exits from the openings. If the gas knife opening 210 and the gas supply opening 220 are supplied with gas (e.g. $CO_2$) from the same gas source, then having a smaller surface area for the gas knife opening 210 than the gas supply opening 220 can be used to increase the speed of the gas exiting the gas knife opening 210 compared to the speed of the gas exiting the gas supply opening 220. The surface areas of the openings can be selected in addition, or as an alternative, to restricting the second path 215, as a way of controlling the speed of the gas exiting the first path 214 and the second path 215. It is not essential that the overall area of the gas knife opening 210 is smaller than the overall area of the gas supply opening 220, and the areas may be similar or the same, or the area of the gas knife opening 210 may be larger than the gas supply opening 220.

Although providing a gas knife opening 210 and a gas supply opening 220 in any of the above embodiments can have advantages such as reducing the number of bubbles entering into space 11, the gas knife flow rate may still result in water marks on the wafer W when above a certain threshold. Therefore, it may be beneficial to reduce the gas knife flow rate and/or gas knife velocity to try to avoid water marks. This can be done by modulating the gas knife flow rate when the fluid handling structure 12 is in use.

In an embodiment, the amount of gas supplied to the gas supply opening 220 and/or the gas knife opening 210 is variable. In an embodiment, the gas supplied to the gas supply opening 220 and/or the gas knife opening 210 is dynamically controlled, i.e. the gas supplied can be controlled and varied during use. For example, the gas emitted from either the gas supply opening 220 and/or the gas knife opening 210 may be dynamically controlled depending on certain characteristics of the fluid handling structure 12, including but not limited to, the direction of movement, the speed, the velocity, and/or the location of the fluid handling structure 12.

In an embodiment, the gas knife opening 210 comprises a series of discrete apertures. For example, the gas knife opening 210 may be provided with two discrete apertures, for example each aperture being two sides of the shape formed by the gas knife opening 210 shown in FIGS. 5 and 6. Alternatively, the gas knife opening 210 may have a single discrete aperture along each side of the shape formed by the gas knife opening 210 shown in FIGS. 5 and 6. Thus, the gas knife opening 210 may be provided by four discrete apertures. The shape of each aperture is not particularly limited and the gas knife opening 210 may be provided by any number of discrete apertures.

Each aperture may be individually controlled to vary the gas flow rate and/or gas velocity of the gas exiting the different apertures of the gas knife opening 210. At least one of the apertures may be dynamically controlled depending on certain characteristics of the fluid handling structure 12, including but not limited to, the direction of movement, the speed, the velocity, and/or the location of the fluid handling structure 12. For example, when in use, apertures of the gas knife opening 210 on the advancing side of the fluid handling structure 12 may be controlled to have gas exiting at a lower gas flow rate and/or gas velocity than the flow rate and/or gas velocity respectively of gas exiting apertures of the gas knife opening 210 on the receding side of the fluid handling structure.

Similarly, the gas supply opening 220 may additionally or alternatively comprise a series of discrete apertures as herein described, which may be individually controlled as herein described.

In an embodiment, the gas supplied to the gas knife opening 210 may be dynamically controlled such as to reduce the amount of gas being supplied to the gas knife opening 210. In an embodiment, the gas supplied to the gas knife opening 210 may be reduced by redirecting some of the gas from the gas knife opening 210 to the gas supply opening 220. In other words, some of the gas is redirected so that instead of passing through the first path 214, some of the gas passes through the second path 215. The amount of gas passing through the second path 215 may be dynamically controlled to alter the gas flow rate and/or gas velocity of the gas exiting the gas knife opening 210.

In an embodiment, a valve may be provided which allows more gas to be directed to the gas supply opening 220, thus reducing the amount of gas exiting the gas knife opening 210. Alternatively, the valve may be varied to reduce the amount of gas directed to the gas supply opening 220, thus increasing the amount of gas exiting the gas knife opening 210. The valve may be variable to allow the amount of gas passing through it to be dynamically controlled. The gas passing through the second path 215 may be dynamically controlled by using a valve 217 in the second path 215, as depicted in FIG. 11. The valve 217 may be variable to allow different amounts of gas to pass through the second path 215. In this way, gas can be by-passed from the gas knife opening 210 to reduce the gas flow rate and/or gas velocity of the gas exiting the gas knife opening 210.

In an embodiment, the gas supply reservoir 213 may a device configured to dynamically control the gas flow rate and/or gas velocity exiting the gas supply opening 220 and/or the gas knife opening 210. For example, the gas supply reservoir 213 may comprise a valve, similar to valve 217, except located in the gas supply reservoir 213.

Although FIG. 11 depicts the gas supply reservoir 213 and a reduction in flow-through area 216, these are both optional features which may or may not be included as part of the means for controlling gas flow out of the gas knife opening 210 and/or the gas supply opening 220.

In an embodiment, the first gas supply 211a and/or the second gas supply 211b, as depicted in FIG. 12 may be controlled to vary the gas flow rate and/or gas velocity exiting the gas knife opening 210 and the gas supply opening 220 respectively. In an embodiment, at least one of the first gas supply reservoir 213a or the second gas supply reservoir 213b may comprise means for dynamically controlling the gas flow rate and/or gas velocity exiting the gas supply opening 220 and/or the gas knife opening 210. In an embodiment, a device configured to control the flow rate and/or gas velocity exiting the gas knife opening 210 and the gas supply opening 220 may be provided along, or as part of, the first path 214 or the second path 215 respectively. For example, a valve (such as depicted in FIG. 11) may be provided to vary the gas flow through the first path 214 and/or second path 215 respectively.

Figure 13:
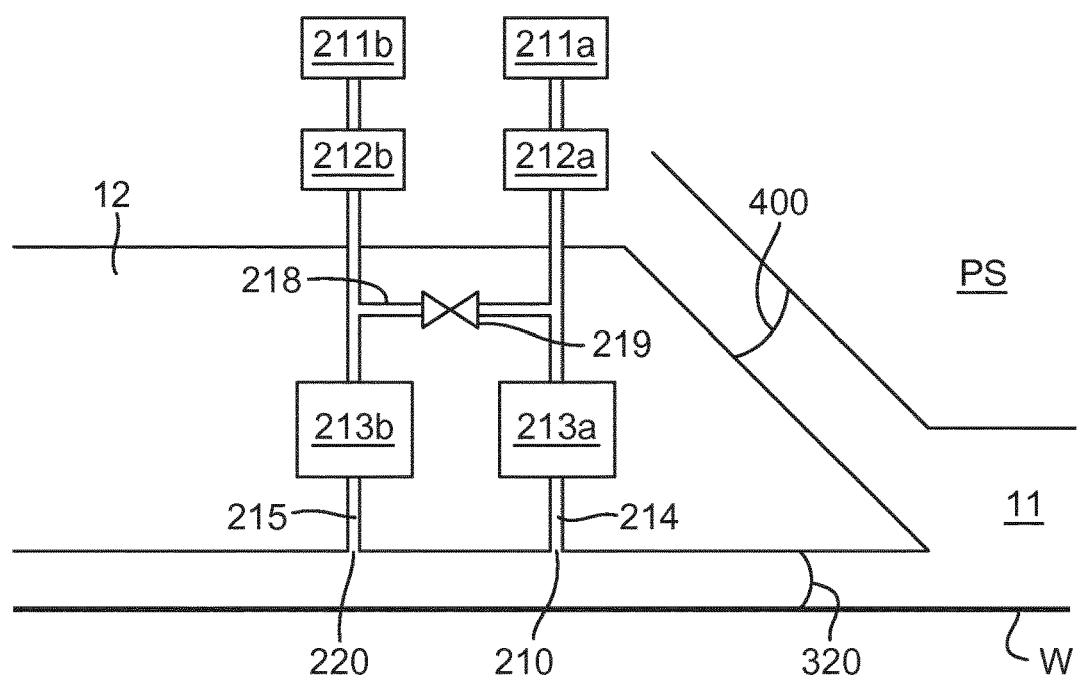
FIG. 13 depicts, in cross-section an immersion system for use in a lithographic apparatus.

In an embodiment, whether or not any one of the first gas supply 211a, second gas supply 211b, first gas supply reservoir 213a or second gas supply reservoir 213b is dynamically controlled, gas exiting the gas knife opening 210 may be dynamically controlled by re-directing gas flow towards the gas supply opening. 220 For example, the fluid handling structure 12 may comprise a third path 218 between the first path 214 and the second path 215, as depicted in FIG. 13. The third path 218 may comprise a device configured, for example valve 219, to dynamically control the gas flow from the first path 214 to the second path 215, or vice versa. When the valve 219 is closed, no flow may travel to or from the first path 214 from or to the second path 215 respectively. However, the valve 219 may be opened by varying amounts to control gas flow from the first path 214 to the second path 215, to re-direct gas from the gas knife opening 210 to the gas supply opening 220. Alternatively, the valve 219 may be opened by varying amounts to control gas flow from the second path 215 to the first path 214, to re-direct gas from the gas supply opening 220 to the gas knife opening 210.

FIG. 13 depicts the third path 218 being located before the first gas supply reservoir 213a and the second gas supply reservoir 213b. However, the third path 218 could be located between any point on the first path 214 and the second path 215. In an embodiment, the third path 218 could be located after the first gas supply reservoir 213a and the second gas supply reservoir 213b, i.e. on the side of the resevoirs nearer the gas knife opening 210 and the gas supply opening 220 respectively. In an embodiment, the third path 218 may be located between a point before a reservoir on one path and a point after a reservoir on the other path. In an embodiment, a fluid handling structure 12 could be provided as in FIG. 13 except that only one of the resevoirs is provided, or neither.

The valve in any of the above embodiments, e.g. valve 217 and valve 219, may be any type of valve which allows variable control of gas through the respective path and/or reservoir as appropriate. Any of the above mentioned valves may be electronically controlled. Any of the above mentioned valves may comprise an actuator.

In an embodiment the lithographic apparatus comprises an underpressure source 222 (illustrated in FIG. 1) connectable to the at least one gas recovery opening 61.

In an embodiment the immersion liquid provided may be acidic or alkali, irrespective of the type of fluid handling structure 12. The idea of providing an acidic immersion liquid has previously been described in EP 1,482,372, herein incorporated in its entirety by reference, in connection with reducing interaction of immersion liquid with top coat. However, this document does not appreciate the possibility of increasing scan speed as a result of the acidic immersion liquid. In an embodiment, normal (e.g. neutral) immersion liquid may be used and acidic or alkaline immersion liquid may be provided through a liquid supply opening in the undersurface of the fluid handling structure 12 radially inwardly of the meniscus controlling feature. An example of such a liquid supply opening is the opening 180 illustrated in FIG. 4. A similar opening may be present in any of the other embodiments described herein.

In any of the above embodiments, the gas supply opening 220 may be in a radially inward direction of the at least one gas knife opening 210. Thus the gas knife opening 210 may be radially outward of the gas supply opening 220 and the space 11.

In any of the above embodiments, the fluid handling structure 12 may be controlled to switch off the gas knife, i.e. to prevent gas exiting from the at least one gas knife opening 210. In such an embodiment, other aspects of the lithographic apparatus may be altered to avoid or reduce the likelihood of a bubble being included in the immersion liquid, for example, the scan speed may be reduced when the gas knife is turned off.

As will be appreciated, any of the above described features can be used with any other feature and it is not only those combinations explicitly described which are covered in this application. The immersion system of any one of the above embodiments may be used in a device manufacturing method or in a lithographic apparatus.

A fluid handling structure 12 may be provided as any one of the fluid handling structures 12 described above or for use in any of the immersion systems described above. The fluid handling structure 12 may be configured to maintain immersion fluid to a region, the fluid handling structure 12 having, at a boundary of a space 11. The fluid handling structure 12 may have at least one gas knife opening 210 in a radially outward direction from the space 11 and at least one gas supply opening 220 in the radially outward direction from the at least one gas knife opening 210 relative to the space 11. The at least one gas supply opening 220 may comprise a mesh. The mesh may be replaced with a sieve, porous material and/or an array of holes. For example, the array of holes may be an array of two or three rows of holes. The array of holes may comprise holes of approximately 10 μm to 60 μm. The gas supply opening 220 may have a mesh, sieve, porous material and/or array of holes to make the flow of gas exiting the gas supply opening 220 more laminar (than if no mesh, sieve, porous material or array of holes is provided) to avoid, or reduce the likelihood of, gas exiting the gas supply opening 220 from mixing with air.

In an embodiment, there is provided an immersion system comprising a fluid handling structure configured to contain immersion fluid to a region, the fluid handling structure having, at a boundary of a space: at least one gas knife opening in a radially outward direction from the space; and at least one gas supply opening in the radially outward direction from the at least one gas knife opening relative to the space; and the immersion system further comprising a gas supply system configured to supply substantially pure $CO_2$ gas through the at least one gas knife opening and the at least one gas supply opening so as to provide an atmosphere of substantially pure $CO_2$ gas adjacent to, and radially outward of, the space.

In an embodiment, the gas exits the at least one gas knife opening at a first gas velocity and the gas exits the at least one gas supply opening at a second gas velocity, the first gas velocity being greater than the second gas velocity. In an embodiment, the substantially pure $CO_2$ gas is humidified $CO_2$ gas. In an embodiment, the fluid handling structure comprises a meniscus controlling feature to resist passage of the immersion fluid in a radially outward direction from the space, the meniscus controlling feature being radially inward of the at least one gas knife opening. In an embodiment, the gas exits the at least one gas knife opening at a first flow speed and the gas exits the at least one gas supply opening at a second flow speed, the first flow speed being greater than the second flow speed. In an embodiment, the fluid handling structure comprises the gas supply system. In an embodiment, the gas supply system comprises at least one gas source to provide gas to the at least one gas knife opening and the at least one gas supply opening. In an embodiment, the gas supply system comprises a first path between a first gas source and the at least one gas knife opening and a second path between a second gas source and the at least one gas supply opening, wherein the second path comprises a flow restrictor section, and optionally, wherein the flow restrictor section is a bend and/or reduction in a flow-through area in the second path. In an embodiment, the first gas source and the second gas source are the same gas source. In an embodiment, the at least one gas knife opening and the at least one gas supply opening are on a surface of the fluid handling structure facing a substrate and/or a substrate table, wherein the at least one gas knife opening is closer to the substrate and/or substrate table than the at least one gas supply opening, and/or the at least one gas knife opening has a smaller surface area on the surface of the fluid handling structure than the at least one gas supply opening. In an embodiment, the fluid handling structure is configured to dynamically control the amount of gas supplied to the gas knife opening by redirecting gas to the gas knife opening from the gas supply opening, or from the gas knife opening to the gas supply opening.

In an embodiment, there is provided an immersion system comprising a fluid handling structure configured to contain immersion fluid to a region, the fluid handling structure having, at a boundary of a space: at least one gas knife opening in a radially outward direction from the space; at least one gas supply opening in the radially outward direction from the at least one gas knife opening relative to the space; and a gas supply system configured to supply gas through the at least one gas knife opening and the at least one gas supply opening, wherein gas exits the at least one gas knife opening at a higher gas velocity than gas exiting the at least one gas supply opening.

In an embodiment, the fluid handling structure comprises a meniscus controlling feature to resist passage of the immersion fluid in a radially outward direction from the space, the meniscus controlling feature being radially inward of the at least one gas knife opening. In an embodiment, the gas exits the at least one gas knife opening at a first flow speed and the gas exits the at least one gas supply opening at a second flow speed, the first flow speed being greater than the second flow speed. In an embodiment, the fluid handling structure comprises the gas supply system. In an embodiment, the gas supply system comprises at least one gas source to provide gas to the at least one gas knife opening and the at least one gas supply opening. In an embodiment, the gas supply system comprises a first path between a first gas source and the at least one gas knife opening and a second path between a second gas source and the at least one gas supply opening, wherein the second path comprises a flow restrictor section, and optionally, wherein the flow restrictor section is a bend and/or reduction in a flow-through area in the second path. In an embodiment, the first gas source and the second gas source are the same gas source. In an embodiment, the at least one gas knife opening and the at least one gas supply opening are on a surface of the fluid handling structure facing a substrate and/or a substrate table, wherein the at least one gas knife opening is closer to the substrate and/or substrate table than the at least one gas supply opening, and/or the at least one gas knife opening has a smaller surface area on the surface of the fluid handling structure than the at least one gas supply opening. In an embodiment, the fluid handling structure is configured to dynamically control the amount of gas supplied to the gas knife opening by redirecting gas to the gas knife opening from the gas supply opening, or from the gas knife opening to the gas supply opening.

In an embodiment, there is provided a device manufacturing method comprising projecting a projection beam of radiation via an immersion fluid onto a substrate in a lithographic apparatus comprising an immersion system, wherein the immersion system comprises a fluid handling structure configured to contain the immersion fluid to a region, the fluid handling structure having, at a boundary of a space: at least one gas knife opening in a radially outward direction from the space; and at least one gas supply opening in the radially outward direction from the at least one gas knife opening relative to the space; and the method comprising supplying substantially pure $CO_2$ gas through the at least one gas knife opening and the at least one gas supply opening so as to provide an atmosphere of substantially pure $CO_2$ gas adjacent to, and radially outward of, the space, or supplying gas through the at least one gas knife opening and the at least one gas supply opening, wherein gas exits the at least one gas knife opening at a higher gas velocity than gas exiting the at least one gas supply opening.

In an embodiment, there is provided a lithographic apparatus comprising an immersion system comprising a fluid handling structure configured to contain immersion fluid to a region, the fluid handling structure having, at a boundary of a space: at least one gas knife opening in a radially outward direction from the space; and at least one gas supply opening in the radially outward direction from the at least one gas knife opening relative to the space; and the immersion system further comprising a gas supply system configured to supply substantially pure $CO_2$ gas the at least one gas knife opening and the at least one gas supply opening so as to provide an atmosphere of substantially pure $CO_2$ gas adjacent to, and radially outward of, the space, or a gas supply system configured to supply gas through the at least one gas knife opening and the at least one gas supply opening, wherein gas exits the at least one gas knife opening at a higher gas velocity than gas exiting the at least one gas supply opening.

In an embodiment, there is provided a fluid handling structure configured to contain immersion fluid to a region, the fluid handling structure having, at a boundary of a space: at least one gas knife opening in a radially outward direction from the space; and at least one gas supply opening in the radially outward direction from the at least one gas knife opening relative to the space, wherein the at least one gas supply opening comprises a mesh, a sieve, porous material and/or array of holes.

Although specific reference may be made in this text to the use of lithographic apparatus in the manufacture of integrated circuits, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate W and develops the exposed resist), a metrology tool and/or an inspection tool. Where applicable, the disclosure herein may be applied to such and other substrate processing tools. Further, the substrate W may be processed more than once, for example in order to create a multi-layer integrated circuit, so that the term substrate W used herein may also refer to a substrate W that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus. In particular, but not exclusively, those types mentioned above and whether the immersion liquid is provided in the form of a bath, only on a localized surface area of the substrate W, or is unconfined. In an unconfined arrangement, the immersion liquid may flow over the surface of the substrate W and/or substrate table WT so that substantially the entire uncovered surface of the substrate table WT and/or substrate W is wetted. In such an unconfined immersion system, the liquid supply system may not confine the immersion liquid or it may provide a proportion of immersion liquid confinement, but not substantially complete confinement of the immersion liquid.

One or more embodiments of the invention may be used in a device manufacturing method.

A liquid supply system as contemplated herein should be broadly construed. In certain embodiments, it may be a mechanism or combination of structures that provides a liquid to a space 11 between the projection system PS and the substrate W and/or substrate table WT. It may comprise a combination of one or more structures, one or more fluid openings including one or more liquid openings, one or more gas openings or one or more openings for two phase flow. The openings may each be an inlet into the immersion space 11 (or an outlet from a fluid handling structure) or an outlet out of the immersion space 11 (or an inlet into the fluid handling structure). In an embodiment, a surface of the space 11 may be a portion of the substrate W and/or substrate table WT, or a surface of the space 11 may completely cover a surface of the substrate W and/or substrate table WT, or the space 11 may envelop the substrate W and/or substrate table WT. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling system comprising:
a fluid handling structure configured to contain immersion fluid to a region, the fluid handling structure having, at a boundary of a space:
at least one gas knife opening outward from the space, and
at least one gas supply opening outward from the at least one gas knife opening relative to the space; and
a gas supply system configured to supply substantially pure $CO_2$ gas through the at least one gas knife opening and the at least one gas supply opening so as to provide an atmosphere of substantially pure $CO_2$ gas adjacent to, and outward of, the space, the gas supply system comprising at least one gas source, fluidly connected or connectable to the at least one gas knife opening and the at least one gas supply opening, to provide the substantially pure $CO_2$ gas to the at least one gas knife opening and the at least one gas supply opening.

2. The fluid handling system of claim 1, wherein the gas supply system is configured to supply gas such that gas exits the at least one gas knife opening at a first gas velocity and the gas exits the at least one gas supply opening at a second gas velocity, the first gas velocity being greater than the second gas velocity.

3. The fluid handling system of claim 1, wherein the gas supply system is further configured to supply the substantially pure $CO_2$ gas along with water vapor.

4. The fluid handling system of claim 1, wherein the gas supply system is further configured to dynamically control gas supplied to the at least one gas knife opening and/or the at least one gas supply opening depending on a certain positional characteristic associated with the fluid handling structure.

5. A fluid handling system comprising:
a fluid handling structure configured to contain immersion fluid to a region, the fluid handling structure having, at a boundary of a space:
at least one gas knife opening outward from the space, and
at least one gas supply opening outward from the at least one gas knife opening relative to the space; and
a gas supply system configured to supply gas through the at least one gas knife opening and the at least one gas supply opening, wherein the gas supply system is configured to supply gas so that gas exits the at least one gas knife opening at a higher gas velocity than gas exiting the at least one gas supply opening and configured to dynamically control gas supplied to the at least one gas knife opening and/or at least one gas supply opening depending on a certain positional characteristic associated with the fluid handling structure.

6. The fluid handling system of claim 5, wherein the fluid handling structure comprises a meniscus controlling feature to resist passage of the immersion fluid in a radially outward direction from the space, the meniscus controlling feature being inward of the at least one gas knife opening.

7. The fluid handling system of claim 5, wherein the fluid handling structure comprises the gas supply system.

8. The fluid handling system of claim 5, wherein the gas supply system comprises at least one gas source to provide gas to the at least one gas knife opening and the at least one gas supply opening.

9. The fluid handling system of claim 8, wherein the gas supply system comprises a first path between a first gas source and the at least one gas knife opening and a second path between a second gas source and the at least one gas supply opening, wherein the second path comprises a flow restrictor section.

10. The fluid handling system of claim 9, wherein the first gas source and the second gas source are the same gas source.

11. The fluid handling system of claim 5, wherein the at least one gas knife opening and the at least one gas supply opening are on a surface of the fluid handling structure facing a substrate and/or a substrate table, wherein:
the at least one gas knife opening is closer to the substrate and/or substrate table than the at least one gas supply opening, and/or
the at least one gas knife opening has a smaller surface area on the surface of the fluid handling structure than the at least one gas supply opening.

12. The fluid handling system of claim 5, wherein the fluid handling structure is configured to dynamically control the amount of gas supplied to the at least one gas knife opening by redirecting gas for the at least gas supply opening to the at least one gas knife opening, or for the at least one gas knife opening to the at least one gas supply opening.

13. The fluid handling system of claim 5, wherein the characteristic comprises a location of the fluid handling structure, a direction of movement, a speed, and/or a velocity.

14. A device manufacturing method comprising projecting a projection beam of radiation via an immersion fluid onto a substrate in a lithographic apparatus comprising an immersion system, wherein the immersion system comprises a fluid handling structure configured to contain the immersion fluid to a region, the fluid handling structure having, at a boundary of a space:
at least one gas knife opening outward from the space; and
at least one gas supply opening outward from the at least one gas knife opening relative to the space; and
the method comprising supplying substantially pure $CO_2$ gas through the at least one gas knife opening and the at least one gas supply opening so as to provide an atmosphere of substantially pure $CO_2$ gas adjacent to, and outward of, the space, or
the method comprising supplying gas through the at least one gas knife opening and the at least one gas supply opening, wherein gas exits the at least one gas knife opening at a higher gas velocity than gas exiting the at least one gas supply opening, and dynamically controlling gas supplied to the at least one gas knife opening and/or at least one gas supply opening depending on a certain positional characteristic associated with the fluid handling structure.

15. The method of claim 14, comprising the supplying gas through the at least one gas knife opening and the at least one gas supply opening, wherein gas exits the at least one gas knife opening at a higher gas velocity than gas exiting the at least one gas supply opening, and dynamically controlling gas supplied to the at least one gas knife opening and/or at least one gas supply opening depending on a certain positional characteristic associated with the fluid handling structure.

16. The method of claim 14, comprising the supplying substantially pure $CO_2$ gas through the at least one gas knife opening and the at least one gas supply opening so as to provide an atmosphere of substantially pure $CO_2$ gas adjacent to, and outward of, the space.

17. A lithographic apparatus comprising an immersion system comprising a fluid handling structure configured to contain immersion fluid to a region, the fluid handling structure having, at a boundary of a space:
   at least one gas knife opening outward from the space; and
   at least one gas supply opening outward from the at least one gas knife opening relative to the space; and
   the immersion system further comprising:
   a gas supply system configured to supply substantially pure $CO_2$ gas through the at least one gas knife opening and the at least one gas supply opening so as to provide an atmosphere of substantially pure $CO_2$ gas adjacent to, and outward of, the space, or
   a gas supply system configured to supply gas through the at least one gas knife opening and the at least one gas supply opening, wherein the gas supply system is configured to supply gas so that gas exits the at least one gas knife opening at a higher gas velocity than gas exiting the at least one gas supply opening and configured to dynamically control gas supplied to the at least one gas knife opening and/or the at least one gas supply opening depending on a certain positional characteristic associated with the fluid handling structure.

18. The lithographic apparatus of claim 17, comprising the gas supply system configured to supply gas through the at least one gas knife opening and the at least one gas supply opening, wherein the gas supply system is configured to supply gas so that gas exits the at least one gas knife opening at a higher gas velocity than gas exiting the at least one gas supply opening and configured to dynamically control gas supplied to the at least one gas knife opening and/or the at least one gas supply opening depending on a certain characteristic associated with the fluid handling structure.

19. The lithographic apparatus of claim 18, wherein the characteristic comprises a location of the fluid handling structure, a direction of movement, a speed, and/or a velocity.

20. A fluid handling structure configured to contain immersion fluid to a region, the fluid handling structure having, at a boundary of a space:
   at least one gas knife opening in outward from the space; and
   at least one gas supply opening outward from the at least one gas knife opening relative to the space, wherein the at least one gas supply opening comprises a mesh, a sieve, porous material and/or array of holes; and
   a gas supply system configured to supply gas through the at least one gas knife opening and the at least one gas supply opening, wherein the gas supply system is configured to supply gas so that gas exits the at least one gas knife opening at a higher gas velocity than gas exiting the at least one gas supply opening and configured to dynamically control gas supplied to the at least one gas knife opening and/or the at least one gas supply opening depending on a certain positional characteristic associated with the fluid handling structure.

* * * * *